(12) United States Patent
Naito

(10) Patent No.: US 11,195,908 B2
(45) Date of Patent: Dec. 7, 2021

(54) SEMICONDUCTOR DEVICE WITH CARRIER LIFETIME CONTROL

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 6 days.

(21) Appl. No.: 16/663,301

(22) Filed: Oct. 24, 2019

(65) Prior Publication Data

US 2020/0058735 A1 Feb. 20, 2020

Related U.S. Application Data

(63) Continuation of application No. PCT/JP2018/042289, filed on Nov. 15, 2018.

(30) Foreign Application Priority Data

Nov. 16, 2017 (JP) .............................. JP2017-221353

(51) Int. Cl.
*H01L 29/06* (2006.01)
*H01L 27/06* (2006.01)
(Continued)

(52) U.S. Cl.
CPC ...... *H01L 29/0623* (2013.01); *H01L 27/0629* (2013.01); *H01L 27/0647* (2013.01);
(Continued)

(58) Field of Classification Search
CPC ... H01L 29/861; H01L 21/8234; H01L 27/06; H01L 29/1095; H01L 29/12;
(Continued)

(56) References Cited

U.S. PATENT DOCUMENTS 10,170,607 B2   1/2019  Kenji
2009/0242931 A1  10/2009  Yukio
(Continued)

FOREIGN PATENT DOCUMENTS

JP   H1197715 A    4/1999
JP   2009267394 A  11/2009
(Continued)

OTHER PUBLICATIONS

International Search Report and (ISA/237) Written Opinion of the International Search Authority for International Patent Application No. PCT/JP2018/042289, mailed by the Japan Patent Office dated Jan. 29, 2019.

*Primary Examiner* — Shahed Ahmed

(57) ABSTRACT

Provided is a semiconductor device comprising: a semiconductor substrate; an active section provided in the semiconductor substrate; an edge termination structure section provided between the active section and an outer peripheral edge of the semiconductor substrate on an upper surface of the semiconductor substrate; and an end lifetime control unit that is provided in the semiconductor substrate in the edge termination structure section and is continuous in a range facing at least two or more diode sections arranged in the first direction, wherein the active section includes: a transistor section and the diode sections alternately arranged with the transistor section in a predetermined first direction on the upper surface of the semiconductor substrate.

20 Claims, 28 Drawing Sheets

(51) Int. Cl.
*H01L 29/10* (2006.01)
*H01L 29/739* (2006.01)
*H01L 29/861* (2006.01)

(52) U.S. Cl.
CPC ...... *H01L 29/0692* (2013.01); *H01L 29/1095* (2013.01); *H01L 29/7397* (2013.01); *H01L 29/861* (2013.01)

(58) Field of Classification Search
CPC ... H01L 29/739; H01L 29/78; H01L 29/0619; H01L 29/7811; H01L 29/7804; H01L 29/7813; H01L 27/0727; H01L 29/32; H01L 29/8613; H01L 29/7802; H01L 29/083; H01L 29/404; H01L 29/407; H01L 29/0696; H01L 29/7397; H01L 29/66325–29/66348; H01L 29/7393–29/7398
See application file for complete search history.

(56) References Cited

U.S. PATENT DOCUMENTS

| | | |
|---|---|---|
| 2010/0156506 A1 | 6/2010 | Yukio |
| 2012/0043582 A1 | 2/2012 | Masaki |
| 2012/0319163 A1* | 12/2012 | Tsuzuki .............. H01L 29/7397 257/140 |
| 2013/0075783 A1* | 3/2013 | Yamazaki ............... H01L 29/36 257/139 |
| 2015/0228717 A1* | 8/2015 | Hara .................. H01L 29/0626 257/140 |
| 2017/0069625 A1* | 3/2017 | Hirabayashi ...... H01L 21/26513 |
| 2017/0077216 A1* | 3/2017 | Kouno ................ H01L 27/0664 |
| 2017/0222029 A1* | 8/2017 | Kono .................. H01L 29/0804 |
| 2017/0236908 A1* | 8/2017 | Naito ................. H01L 29/4238 257/48 |
| 2017/0263603 A1 | 9/2017 | Hiroshi |

FOREIGN PATENT DOCUMENTS

| | | |
|---|---|---|
| JP | 2012043891 A | 3/2012 |
| JP | 2012156564 A | 8/2012 |
| JP | 2013149909 A | 8/2013 |
| JP | 2015065464 A | 4/2015 |
| JP | 2015153784 A | 8/2015 |
| JP | 2016072359 A | 5/2016 |
| JP | 2017045949 A | 3/2017 |
| JP | 2017135339 A | 8/2017 |
| JP | 2017147435 A | 8/2017 |

* cited by examiner

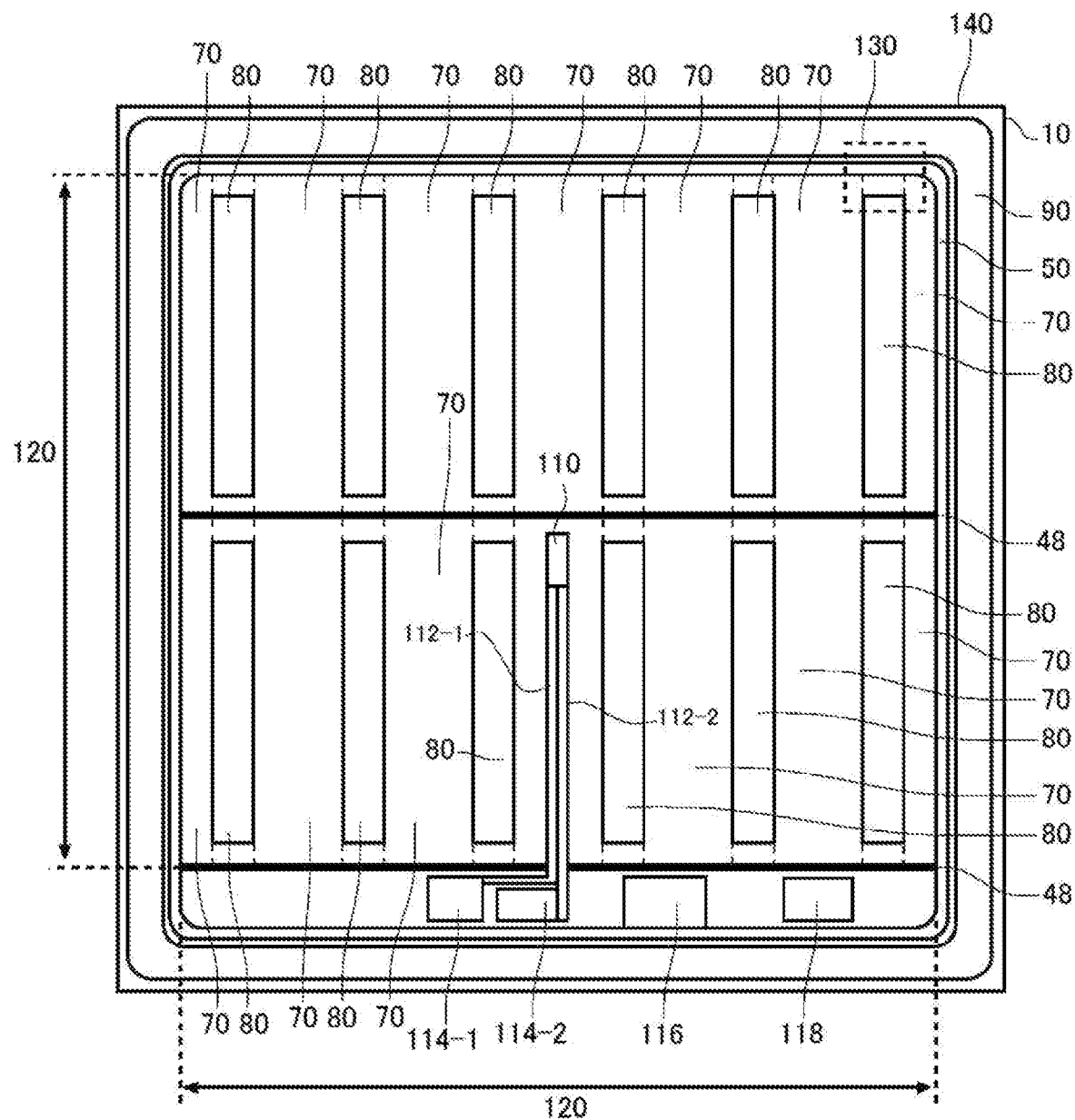
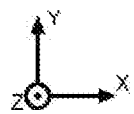
FIG. 1

SEMICONDUCTOR DEVICE WITH CARRIER LIFETIME CONTROL

The contents of the following Japanese patent applications are incorporated herein by reference:
NO. 2017-221353 filed in JP on Nov. 16, 2017, and
NO. PCT/JP2018/042289 filed on Nov. 15, 2018.

BACKGROUND

1. Technical Field

The present invention relates to a semiconductor device.

2. Related Art

As a semiconductor device, a reverse conduction IGBT (RC-IGBT) having the same semiconductor substrate provided with an insulated gate bipolar transistor (IGBT) and a diode such as a freewheeling diode (FWD) is known (see, for example, Patent Document 1).
Patent Document 1: Japanese Patent Application Publication No. 11-97715

In a semiconductor device, it is preferable to improve characteristics of a turn off withstand capability or the like.

To solve the above problem, in a first aspect of the present invention, a semiconductor device including a semiconductor substrate is provided. The semiconductor device may include an active section provided in the semiconductor substrate. The semiconductor device may include an edge termination structure section provided between the active section and an outer peripheral edge of the semiconductor substrate on an upper surface of the semiconductor substrate. The active section may include a transistor section. The active section may include diode sections alternately arranged with the transistor section in a predetermined first direction on the upper surface of the semiconductor substrate. The semiconductor device may include an end lifetime control unit that is provided in the semiconductor substrate in the edge termination structure section and is continuous in a range facing at least two or more diode sections arranged in the first direction.

The end lifetime control unit is provided in a circular pattern to surround the active section on a plane parallel to the upper surface of the semiconductor substrate. The semiconductor device may include an active section lifetime control unit provided in the semiconductor substrate in the diode sections. The end lifetime control unit and the active section lifetime control unit may be continuous in a second direction perpendicular to the first direction on a plane parallel to the upper surface of the semiconductor substrate.

The end lifetime control unit may include an upper end lifetime control unit arranged closer to the upper surface from a center in the semiconductor substrate in a depth direction perpendicular to the upper surface of the semiconductor substrate. The active section lifetime control unit may include an upper active section lifetime control unit that is arranged closer to the upper surface from a center in the semiconductor substrate in a depth direction perpendicular to the upper surface of the semiconductor substrate. The upper active section lifetime control unit and the upper end lifetime control unit may not be continuous in the first direction.

The transistor section may be provided to an end portion of the active section in the first direction. The upper end lifetime control unit may not overlap at least a part of the transistor section provided to the end portion in the first direction.

The end lifetime control unit may include a lower end lifetime control unit that is arranged closer to a lower surface from a center in the semiconductor substrate in a depth direction perpendicular the upper surface of the semiconductor substrate. The active section lifetime control unit may include a lower active section lifetime control unit that is arranged closer to a lower surface from the center in the semiconductor substrate in a depth direction perpendicular to the upper surface of the semiconductor substrate. The lower active section lifetime control unit and the lower end lifetime control unit may be continuous in the second direction. The end lifetime control unit may not include the upper end lifetime control unit arranged closer to the upper surface from the center in the semiconductor substrate.

The lower end lifetime control unit may not overlap at least a part of the transistor section provided to the end portion in the first direction. The lower end lifetime control unit may overlap an entire region of the transistor section provided to the end portion in the first direction.

The diode sections may include a cathode region that is in contact with the lower surface of the semiconductor substrate in the semiconductor substrate. The lower end lifetime control unit may be arranged in a region not overlapping with the cathode region on a plane parallel to the upper surface of the semiconductor substrate.

An end portion of the lower end lifetime control unit in the second direction perpendicular to the first direction may face an end portion of the cathode region in the second direction. The semiconductor device may include a gate runner provided above the upper surface of the semiconductor substrate in the active section. The active section lifetime control unit may also be arranged below the gate runner.

A width in the first direction of the transistor section provided to an end portion of the active section in the first direction may be larger than a width of another transistor section. A width in the first direction of the transistor section provided to an end portion of the active section in the first direction may be smaller than a width of another transistor section.

In a second aspect of the present invention, provided is a semiconductor device comprising: a semiconductor substrate; a transistor section provided in the semiconductor substrate, diode sections alternately arranged with the transistor section in a predetermined first direction on an upper surface of the semiconductor substrate, wherein a width in a first direction of a transistor section provided to an end portion in the first direction differs from a width of another transistor section among transistor sections 70 arrayed in an X-axis direction.

The summary clause does not necessarily describe all necessary features of the embodiments of the present invention. The present invention may also be a sub-combination of the features described above.

BRIEF DESCRIPTION OF THE DRAWINGS

FIG. 1 illustrates an upper surface structure of a semiconductor device 100 according to one embodiment of the present invention.

DESCRIPTION OF EXEMPLARY EMBODIMENTS

Figure 2:
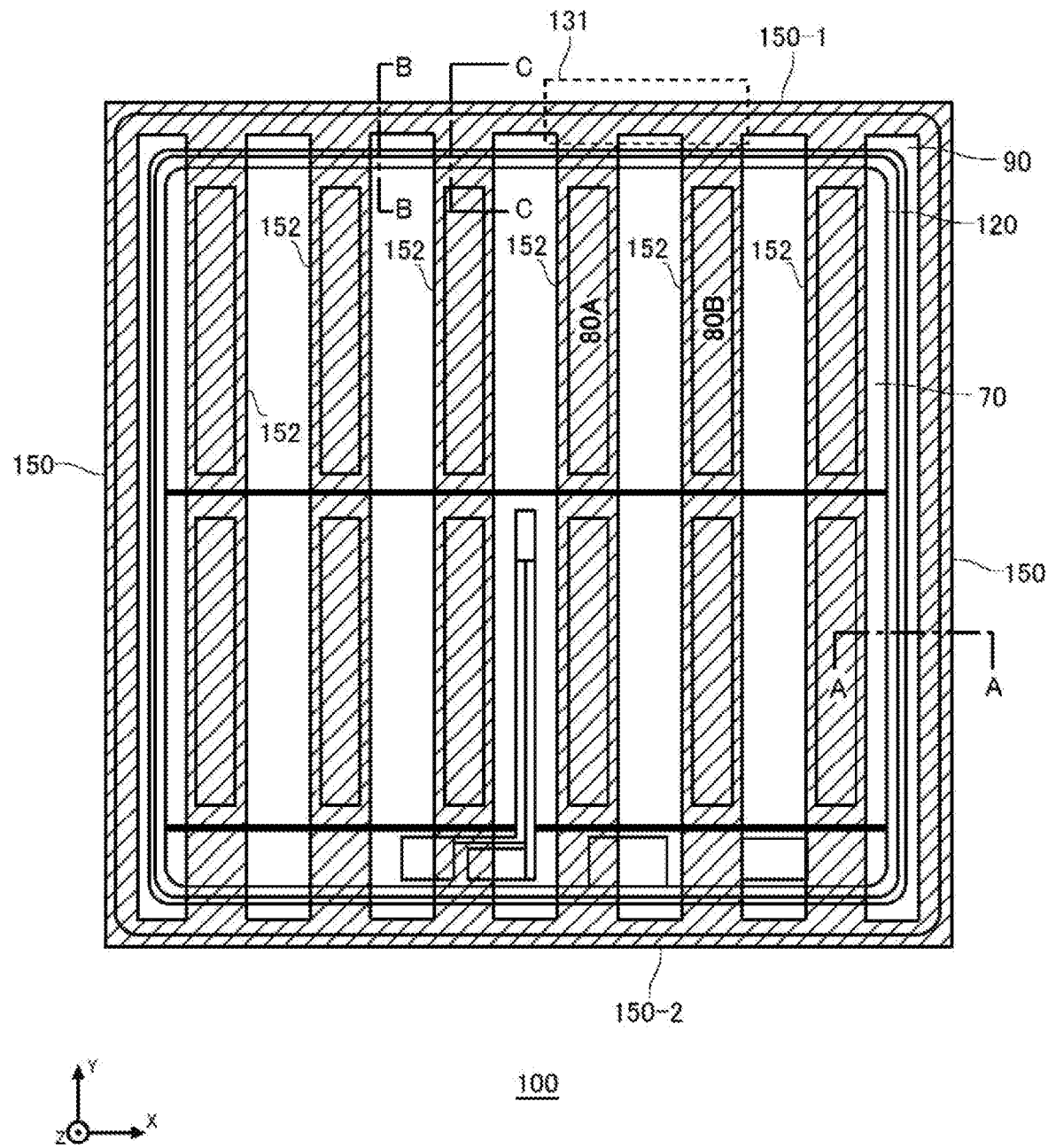
FIG. 2 illustrates an exemplary arrangement of a lifetime control unit provided in a semiconductor substrate 10.

Hereinafter, the present invention is described through the embodiments of the invention. However, the following embodiments do not limit the invention according to the claims. Also, all the combinations of the features described in the embodiments) are not necessarily essential for means provided by aspects of the invention.

In this specification, one side in a direction parallel to the depth direction of a semiconductor substrate is referred to as an "upper" side, and the other side is referred to as a "lower" side. One of two principal surfaces of a substrate, a layer or some other member is referred to as an upper surface, and the other surface is referred to as a lower surface. The "upper" and the "lower" directions are not limited by the direction of gravity or the direction of attachment to a substrate or the like at the time of implementation of a semiconductor device.

In this specification, technical matters may be described using orthogonal coordinate axes of X axis, Y axis and Z axis. In this specification, the X-Y plane is defined as a plane parallel to the upper surface of a semiconductor substrate, and Z-axis is defined to be along a depth direction perpendicular to the upper surface of the semiconductor substrate.

Although a first-conductivity-type is N-type and a second-conductivity-type is P-type in each example embodiment shown below, the first-conductivity-type may also be P-type, and the second-conductivity-type may also be N-type. In this case, conductivity-types of substrates, layers, regions and the like in each example embodiment have opposite polarities, respectively. Also, the reference to (P+)-type (or (N+)-type) in this specification means that it has higher doping concentration than P-type (or N-type), while the reference to (P−)-type (or (N−)-type) means that it has higher doping concentration than P-type (or N-type).

In this specification, doping concentration refers to the concentration of impurities acting as donors or acceptors. In this specification, in some times, a difference of concentration between donors and acceptors is defined as a doping concentration. Also, a peak value of the doping concentration distribution of the doping region may be regarded as doping concentration in the doping region.

FIG. 1 illustrates an upper surface structure of a semiconductor device 100 according to one embodiment of the present invention. The semiconductor device 100 includes a semiconductor substrate 10. The semiconductor substrate 10 may be a silicon substrate, a silicon carbide substrate, or a nitride semiconductor substrate or the like such as a gallium nitride semiconductor substrate. The semiconductor substrate 10 of the present example is a silicon substrate. In this specification, an end portion of an outer perimeter of the semiconductor substrate 10 in a top view is referred to as an outer peripheral edge 140. The top view refers to the view as seen in parallel with the Z axis from an upper surface side of the semiconductor substrate 10.

The semiconductor device 100 includes an active section 120 and an edge termination structure section 90. The active section 120 is a region in which a main current flows between the upper surface and the lower surface of the semiconductor substrate 10 when the semiconductor device 100 is controlled in an ON state. That is, it is a region in which a current flows in the semiconductor substrate 10 from the upper surface to the lower surface or from the lower surface to the upper surface, and flows inside the semiconductor substrate 10 in the depth direction.

The active section 120 includes a transistor section 70 and a diode section 80. In the present specification, the transistor section 70 and the diode section 80 may be referred to as an element section or an element region respectively. The region provided with the element section may be defined as the active section 120. Note that in the top view of the semiconductor substrate 10, the region sandwiched by the two element sections is defined as the active section 120.

In an example of FIG. 1, the active section 120 includes a region that is sandwiched by the element sections and provided with a gate runner 48. The active section 120 can also be provided as a region where the emitter electrode is provided in a top view of the semiconductor substrate 10, and a region sandwiched by regions where the emitter electrodes are provided. In an example of FIG. 1, the emitter electrode is provided above the transistor section 70 and the diode section 80.

The transistor section 70 includes a transistor such as an IGBT. The diode sections 80 are arranged alternately with the transistor sections 70 in a predetermined first direction on the upper surface of the semiconductor substrate 10. The first direction is an X-axis direction in FIG. 1. In the present specification, the first direction may be referred to as an array direction.

In each diode section 80, a (N+)-type cathode region is provided in a region that is in contact with the lower surface of the semiconductor substrate 10. The diode section 80 indicated with a solid line in FIG. 1 is a region provided with the cathode region in the lower surface of the semiconductor substrate 10. In the semiconductor device 100 of the present example, the regions other than the cathode region among the regions that are in contact with the lower surface of the semiconductor substrate are (P+)-type collector regions.

The diode section 80 is a region where the cathode region is projected in the Z-axis direction. The transistor section 70 is a region provided with the collector region in the lower surface of the semiconductor substrate 10 and cyclically provided with unit structures including the upper surface of the semiconductor substrate 10 provided with the (N+)-type emitter region. A boundary between the diode section 80 and the transistor section 70 in the X-axis direction is a boundary between the cathode region and the collector region. In the present specification, the diode section 80 includes a portion in which the region where the cathode region is projected in the Z-axis direction extends to an end portion of the active section 120 in the Y-axis direction (in FIG. 1, illustrated with a dashed line extending in the Y-axis direction from the solid line of the diode section 80).

Transistor sections 70 may be provided to both ends of the active section 120 in the Y-axis direction. The active section 120 may be divided in the Y-axis direction by the gate runner 48. The transistor section 70 and the diode section 80 are arranged alternately in the X-axis direction in each divided region of the active section 120.

The edge termination structure section 90 is provided between the active section 120 and the outer peripheral edge 140 of the semiconductor substrate 10 on the upper surface of the semiconductor substrate 10. The edge termination structure section 90 may be arranged in a circular pattern to surround the active section 120 on the upper surface of the semiconductor substrate 10. The edge termination structure section 90 of the present example is arranged along the outer peripheral edge 140 of the semiconductor substrate 10. The edge termination structure section 90 relaxes an electric field concentration on an upper surface side of the semiconductor substrate 10. The edge termination structure section 90 has a structure of a guard ring, a field plate, a RESURF, and a combination thereof, for example.

A gate metal layer 50 is provided between the edge termination structure section 90 and the active section 120 on the upper surface of the semiconductor substrate 10. Although an interlayer dielectric film is provided between the gate metal layer 50 and the semiconductor substrate 10, it is omitted in FIG. 1.

The gate metal layer 50 may be provided to surround the active section 120 in top view of the semiconductor substrate 10. The gate metal layer 50 is electrically connected to the gate pad 116 provided outside the active section 120. The gate pad 116 may be arranged between the gate metal layer 50 and the active section 120. A pad such as an emitter pad 118 electrically connected to an emitter electrode may be provided between the gate metal layer 50 and the active section 120.

The gate metal layer 50 may be formed of aluminum or an aluminum-silicon alloy. The gate metal layer 50 is electrically connected to the transistor sections 70 to supply gate voltages to the transistor sections 70.

The gate runner 48 is electrically connected to the gate metal layer 50, and extends to above the active section 120. At least one gate runner 48 may be provided to traverse the active section 120 in the X-axis direction. The gate runner 48 supplies a gate voltage to the transistor section 70. The gate runner 48 may be formed of a semiconductor material such as polysilicon doped with impurities, or may be formed of metal. The gate runner 48 is provided above or inside the semiconductor substrate 10 and an insulating film insulates the semiconductor substrate 10 from the gate runner 48.

The semiconductor device 100 of the present example includes a temperature-sensing section 110, a temperature-sensing wire 112, and a temperature sensing pad 114. The temperature-sensing section 110 is provided above the active section 120. The temperature-sensing section 110 may be provided at the center of the active section 120 in top view of the semiconductor substrate 10. The temperature-sensing section 110 senses the temperature of the active section 120. The temperature-sensing section 110 may be a temperature-sensing p-n diode formed of monocrystalline or polycrystalline silicon.

The temperature-sensing wire 112 is provided above the active section 120 in top view of the semiconductor substrate 10. The temperature-sensing wire 112 is connected to the temperature-sensing section 110. The temperature-sensing wire 112 extends to a region between the active section 120 and the outer peripheral edge 140 on the upper surface of the semiconductor substrate 10 and is connected to the temperature sensing pad 114. The temperature-sensing wire 112 may include an anode electrode wire 112-1 electrically connected to a p-type layer of the temperature-sensing p-n diode and a cathode electrode wiring 112-2 electrically connected to an n-type layer. The temperature sensing pad 114 may include an anode pad 114-1 and a cathode pad 114-2.

FIG. 2 illustrates an exemplary arrangement of a lifetime control unit provided inside a semiconductor substrate 10. A region provided with a lifetime control unit in FIG. 2 is represented by a top view indicated with hatch lines of FIG. 1. In FIG. 2, some of reference numerals illustrated in FIG. 1 are omitted.

A lifetime control unit is a region intentionally formed with a lifetime killer by implanting impurities into the semiconductor substrate. The lifetime killer may be a carrier recombination center, a crystal defect, a vacancy in divacancy, a defect complex formed by any of the above and an element constituting the semiconductor substrate 10, a disposition, a noble gas element such as helium and neon, and metal elements such as platinum. The lifetime control unit can be formed by implanting helium and the like into the semiconductor substrate 10.

The lifetime control unit includes an end lifetime control unit provided to the edge termination structure section 90. FIG. 2 illustrates an upper end lifetime control unit 150 as one example of the end lifetime control unit. The upper end lifetime control unit 150 included in the edge termination structure section 90 is provided inside of the semiconductor substrate 10. The upper end lifetime control unit 150 is arranged between the center and the upper surface of the semiconductor substrate 10 in the Z-axis direction.

The upper end lifetime control unit 150 is continuous in the X-axis direction within a range 131 where each upper end lifetime control unit 150 faces at least two or more diode sections 80 (for example, diode sections 80A and 80B). Thus, at a time of turn-off of the semiconductor device 100 (that is, at a time of turn-off of the transistor section 70), it is possible to reduce carriers passing from the edge termination structure section 90 to an emitter region of the transistor section 70. This improves a turn off withstand capability of the semiconductor device 100.

In an example of FIG. 2, the upper end lifetime control unit 150 is provided in a circular pattern to surround the active section 120 on a plane parallel to the upper surface of the semiconductor substrate 10. This allows further reduction of carriers passing from the edge termination structure section 90 to the emitter region of the transistor section 70. The upper end lifetime control unit 150 may be apart from the active section 120 on the upper surface of the semiconductor substrate 10.

The lifetime control unit may further include an active section lifetime control unit provided in the active section 120. FIG. 2 illustrates an upper active section lifetime control unit 152 as one example of the active section lifetime control unit. The upper active section lifetime control unit 152 is provided inside the semiconductor substrate 10 in the active section 120. The upper active section lifetime control unit 152 is arranged between the center and the upper surface of the semiconductor substrate 10 in the Z-axis direction.

At least a part of the upper active section lifetime control unit 152 of the present example is provided in the diode section 80. The upper active section lifetime control unit 152 may overlap the entire diode section 80. In an example of FIG. 2, a width of the upper active section lifetime control unit 152 in the X-axis direction is larger than a width of the diode section 80 in the X-axis direction.

The upper active section lifetime control unit 152 is continuous with the upper end lifetime control unit 150 within a plane parallel to the upper surface of the semiconductor substrate 10 in a second direction (in the present example, Y-axis direction) perpendicular to a first direction. A state where the lifetime control unit is continuous (or are connected) may refer to a state where lifetime killers of almost the same concentration are continuous, or a state where lifetime killers having a higher concentration than a region where lifetime killers are not provided (for example, center region of the semiconductor substrate 10 in depth direction) are continuous. Almost the same concentration refers to a concentration of two times or less, for example. In the present example, the second direction is the Y-axis direction. The upper active section lifetime control unit 152 traverses the active section 120 in the Y-axis direction. In this case, the upper active section lifetime control unit 152 is provided to connect upper end lifetime control units 150-1 and 150-2 that face each other in the Y-axis direction among the upper end lifetime control unit 150.

The upper active section lifetime control unit 152 is not provided in at least some regions of the transistor section 70 on the upper surface of the semiconductor substrate 10. This allows to reduce a leakage current in the transistor section 70 caused by the upper active section lifetime control unit 152.

The upper active section lifetime control unit 152 and the upper end lifetime control unit 150 do not have to be continuous in the X-axis direction. That is, a region is present where an upper side lifetime control unit is not provided between the upper active section lifetime control unit 152 and the upper end lifetime control unit 150. The region may be above the transistor section 70 provided at the end portion of the active section 120 in the X-axis direction. That is, the upper end lifetime control unit 150 and the upper active section lifetime control unit 152 do not overlap at least a part of the transistor section 70 provided at the end portion of the active section 120 in the X-axis direction. This can reduce a leakage current in the transistor section 70.

Figure 3:
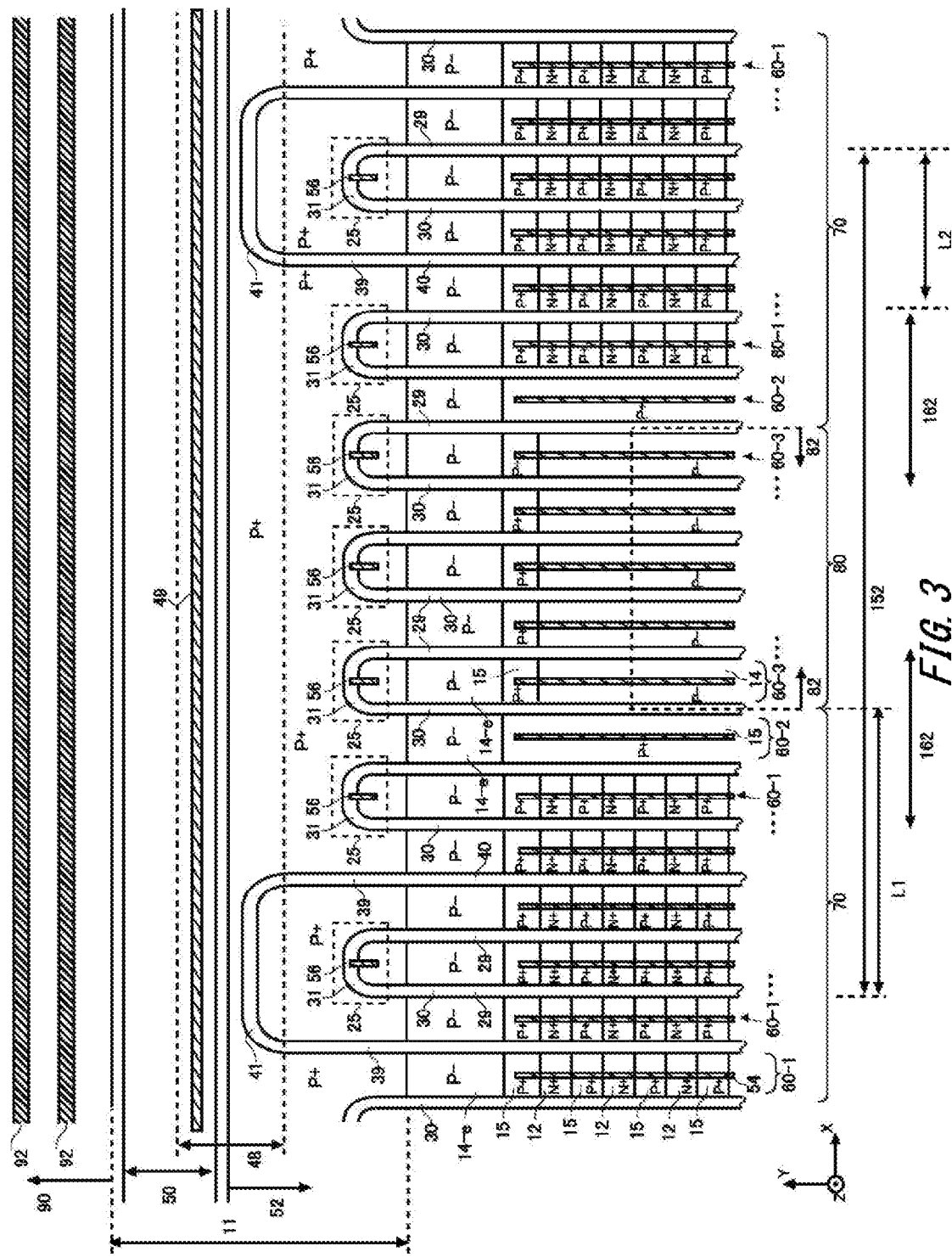
FIG. 3 is an enlarged view of the vicinity of a region 130 in FIG. 1.

FIG. 3 is an enlarged view of the vicinity of a region 130 in FIG. 1. A semiconductor device 100 of the present example includes a guard ring 92, a gate trench section 40, a dummy trench section 30, a (P+)-type well region 11, an (N+)-type emitter region 12, a (P−)-type base region 14, and a (P+)-type contact region 15 that are provided inside a semiconductor substrate 10 and exposed at the upper surface of the semiconductor substrate 10. In the present specification, the gate trench section 40 or the dummy trench section 30 may be simply referred to as a trench section. The semiconductor device 100 of the present example also includes an emitter electrode 52 and a gate metal layer 50 provided above the upper surface of the semiconductor substrate 10. The emitter electrode 52 and the gate metal layer 50 are separated from each other.

An edge termination structure section 90 is arranged outside the gate metal layer 50 (at Y-axis direction positive side). The edge termination structure section 90 may include one or more guard rings 92 as described above. The guard ring 92 is a P-type region provided inside the semiconductor substrate 10. The guard ring 92 is provided in a circular pattern to surround the active section 120 outside the gate metal layer 50.

Although an interlayer dielectric film is provided between the emitter electrode 52 and the gate metal layer 50, and the upper surface of the semiconductor substrate 10, it is omitted in FIG. 3. In the present example, an interlayer dielectric film is provided with contact holes 56, contact holes 49 and contact holes 54 penetrating the interlayer dielectric film.

The emitter electrode 52 is in contact with the emitter region 12, the contact region 15 and the base region 14 on the upper surface of the semiconductor substrate through the contact hole 54. Also, the emitter electrode 52 is connected to a dummy conductive section in the dummy trench section 30 via the contact hole 56. Connection portions 25 formed of conductive material such as polysilicon doped with impurities may be provided between the emitter electrodes 52 and the dummy conductive section. An insulating film such as an oxide film is provided between the connection portions 25 and the upper surface of the semiconductor substrate 10.

The gate metal layer 50 is in contact with the gate runner 48 through the contact hole 49. In FIG. 1, a gate runner 48 in a region 130 is omitted. At the end portion of the active section 120, the gate metal layer 50 and the gate trench section 40 may be connected without intervention of the gate runner 48.

The gate runner 48 is formed of polysilicon doped with impurities or the like. The gate runner 48 is connected to a gate conductive section inside the gate trench section 40 at the upper surface of the semiconductor substrate. The gate runner 48 is not connected to the dummy conductive section in the dummy trench section 30. In the present example, the gate runner 48 is provided from a position below the contact hole 49 to an edge portion 41 of the gate trench section 40.

An insulating film such as an oxide film is provided between the gate runner 48 and the upper surface of the semiconductor substrate 10. At the edge portion 41 of the gate trench section 40, the gate conductive section is exposed on the upper surface of the semiconductor substrate 10. A contact hole to connect the gate conductive section and the gate runner 48 is provided in the insulating film above the gate conductive section. In FIG. 3, the emitter electrode 52 and the gate runner 48 are partially overlapped in plan view, but the emitter electrode 52 and the gate runner 48 are electrically insulated from each other across an unillustrated insulating film.

The emitter electrode 52 and the gate metal layer 50 are formed of a metal-containing material. For example, at least a partial region of each electrode is formed of aluminum or an aluminum-silicon alloy. Each electrode may include a barrier metal formed of titanium, a titanium compound or the like as an under layer of a region formed of aluminum or the like, and may include a plug formed of tungsten or the like in the contact hole.

One or more gate trench sections 40 and one or more dummy trench sections 30 are arrayed at predetermined intervals along a predetermined array direction (the X-axis direction in the present example) on the upper surface of the semiconductor substrate 10. In the transistor section 70 of the present example, one or more gate trench sections 40 and one or more dummy trench sections 30 are alternately provided along an array direction.

A gate trench section 40 of the present example may have two straight line portions 39 extending in a straight line along the longitudinal direction perpendicular to the array direction (the Y-axis direction in the present example) and an edge portion 41 to connect the two straight line portions 39. It is preferable that at least a part of the edge portion 41 is curved on the upper surface of the semiconductor substrate 10. The edge portion 41 connects the end portions of the two straight line portions 39 of the gate trench section 40 to each other, the end portions being ends of their linear shapes along the longitudinal direction. Thereby, electric field concentration at the end portions of the straight line portion 39 can be relaxed. In the present specification, each straight line portion 39 of the gate trench section 40 may be regarded as one gate trench section 40.

At least one dummy trench section 30 is provided between straight line portions 39 of the gate trench section 40. Each dummy trench section 30 may have straight line portions 29 and an edge portion 31 in a manner similar to the gate trench section 40. In another example, the dummy trench section 30 may have a straight line portion 29 and no edge portion 31. In the example illustrated in FIG. 3, two straight line portions 29 of the dummy trench section 30 are arranged between two straight line portions 39 of the gate trench section 40 in the transistor section 70.

In the diode section 80, a plurality of dummy trench sections 30 are arranged along the X-axis direction on the upper surface of the semiconductor substrate 10. The shape of a dummy trench section 30 on the XY plane in the diode section 80 may be similar to a dummy trench section 30 provided in the transistor section 70.

The edge portion 31 and the straight line portion 29 of a dummy trench section 30 have shapes similar to the edge portion 41 and the straight line portion 39 of a gate trench section 40. A dummy trench section 30 provided in the diode section 80 and a linear dummy trench section 30 provided in the transistor section 70 may have the same length in the Y-axis direction.

The emitter electrode 52 is provided above the gate trench section 40, the dummy trench section 30, the well regions 11, the emitter regions 12, the base regions 14 and the contact regions 15. The well region 11 and an end of the contact hole 54 in the longitudinal direction on a side where the gate metal layer 50 is provided are separated from each other in the XY plane. A diffusion depth of the well region 11 may be greater than a depth of the gate trench section 40 and the dummy trench section 30. Partial regions of the gate trench section 40 and the dummy trench section 30 on the gate metal layer 50 side are provided in the well region 11. The well region 11 may cover a bottom of the edge portion 41 of the gate trench section 40 in the Z-axis direction and a bottom of the edge portion 31 of the dummy trench section 30 in the Z-axis direction.

One or more mesa sections 60 sandwiched by trench sections are provided in each of the transistor section 70 and the diode section 80. A mesa section 60 refers to a region of the semiconductor substrate 10 that is sandwiched by trench sections and is closer to the upper surface than the deepest bottom of the trench sections.

The base region 14 is provided in the mesa section 60 sandwiched by trench sections. A base region 14 is a second conductivity type ((P−)-type) region having a lower doping concentration than the well region 11.

A contact region 15 of the second conductivity type having a higher doping concentration than the base region 14 is provided on the upper surface of the base region 14 of the mesa section 60. The contact regions 15 of the present example are of P+ types. The well region 11 may be provided apart from a contact region 15 that is arranged at the farthest end in the Y-axis direction and to a direction of the gate metal layer 50 on the upper surface of the semiconductor substrate 10. The base region 14 is exposed between the well region 11 and the contact region 15 on the upper surface of the semiconductor substrate 10.

In the transistor section 70, the emitter region 12 of the first conductivity type having a higher doping concentration than a drift region inside the semiconductor substrate 10 is selectively provided on an upper surface of a mesa section 60-1. The emitter regions 12 of the present example are of (N+)-type. The base region 14 contacting the emitter region 12 in the depth direction of the semiconductor substrate 10 (-Z-axis direction) is partially in contact with the gate trench section 40, and the contacting portion functions as a channel portion. The base region 14 being provided between the emitter region 12 and the drift region in the Z-axis direction is partially in contact with the gate trench section 40, and an inversion layer of electrons that is a channel is formed to the contacting portion when an on-voltage is applied to the gate trench section 40. The channel formed in the base region 14 allows carriers to flow between the emitter region 12 and the drift region.

In the present example, base regions 14-e are arranged at both ends of each mesa section 60 in the Y-axis direction. In the present example, the contact region 15 is in contact with the base region 14-e at the center side of the upper surface of each mesa section 60. The well region 11 is in contact with the base region 14-e on the opposite side from the contact region 15.

In the mesa section 60-1 in the transistor section 70 of the present example, the contact region 15 and the emitter region 12 are arranged alternately along the Y-axis direction in a region sandwiched by the base regions 14-e at both ends in the Y-axis direction. Each of the contact region 15 and the emitter region 12 is provided from trench sections of one side sandwiching the mesa section 60-1 in the X-axis direction to trench sections at the other side.

In one or more mesa sections 60-2 provided at the boundary with the diode section 80 from among the mesa sections 60 in the transistor section 70, a contact region 15 having a larger area than a contact region 15 in a mesa section 60-1 is provided. The emitter region 12 may not be provided in a mesa section 60-2. In a mesa section 60-2 of the present example, a contact region 15 is provided in the entire region sandwiched by base regions 14-e.

In each mesa section 60-1 of the transistor section 70 of the present example, the contact hole 54 is provided above each of the contact region 15 and emitter region 12. The contact hole 54 in the mesa section 60-2 is provided above the contact region 15. Contact holes 54 in respective mesa sections 60 are not provided in regions corresponding to the base region 14-e and the well region 11. The contact hole 54 of the respective mesa sections 60 in the transistor section 70 may have the same length in the Y-axis direction.

A (N+)-type cathode region 82 is provided in a region of the diode section 80 in contact with the lower surface of the semiconductor substrate 10. In FIG. 3, a region provided with the cathode region 82 is indicated by a dashed line. A (P+)-type collector region may be provided in a partial region in contact with the lower surface of the semiconductor substrate 10 where the cathode region 82 is not provided.

The transistor section 70 may be defined as a region provided with the mesa section 60 including the contact region 15 and the emitter region 12 and the trench section in contact with the mesa section 60 among regions overlapping with the collector region in the Z-axis direction. However, the contact region 15 may be provided in the mesa section 60-2 at the boundary with the diode section 80 instead of the emitter region 12.

The base region 14 is arranged on the upper surface of the mesa section 60-3 in the diode section 80. However, the contact region 15 may be provided in the region in contact with the base region 14-e The contact hole 54 is terminated above the contact region 15. Note that, while the diode section 80 includes five mesa sections 60-3 and six dummy trench sections 30 sandwiching the mesa section 60-3 in the example of FIG. 3, the number of mesa sections 60-3 and the number of dummy trench sections 30 in the diode section 80 are not so limited. A greater number of mesa sections 60-3 and dummy trench sections 30 may be provided in the diode section 80.

An upper active section lifetime control unit 152 may be provided in a range that is wider than the diode section 80 in the X-axis direction as illustrated in FIG. 2. FIG. 3 illustrates, with an arrow, the range where the upper active section lifetime control unit 152 is provided. The upper active section lifetime control unit 152 is provided in a partial region of the transistor section 70 contacting the diode section 80 in the X-axis direction.

A partial length L1 of the upper active section lifetime control unit 152 overlapping with the transistor section 70 in the X-axis direction is, for example 100 µm or longer and 150 µm or shorter. In another example, L1 may be one time or more to 1.5 times or less of a thickness of the semiconductor substrate 10 in the Z-axis direction. L1 may be from ⅕ or less to ⅒ or less of a length of the transistor section 70 in the X-axis direction.

The semiconductor device 100 may include a lower active section lifetime control unit 162. The lower active section lifetime control unit 162 will be described later. FIG. 3 illustrates a range where the lower active section lifetime control unit 162 is provided in the X-axis direction with an arrow. The lower active section lifetime control unit 162 is provided in at least a partial region of the transistor section 70, but is not provided in at least a partial region of the diode section 80. The lower active section lifetime control unit 162 of the present example is provided in a range including a boundary between the transistor section 70 and the diode section 80 in the X-axis direction, a part of the transistor section 70 and a part of the diode section 80.

A distance L2 between an end portion of the upper active section lifetime control unit 152 in the transistor section 70 and an end portion of each lower active section lifetime control unit 162 in the transistor section 70 in the X-axis direction is, for example, 50 µm or more to 100 µm or less. In another example, the distance L2 may be 0.5 times or more to 1.0 times or less of a thickness of the semiconductor substrate 10 in the Z-axis direction.

Figure 4:
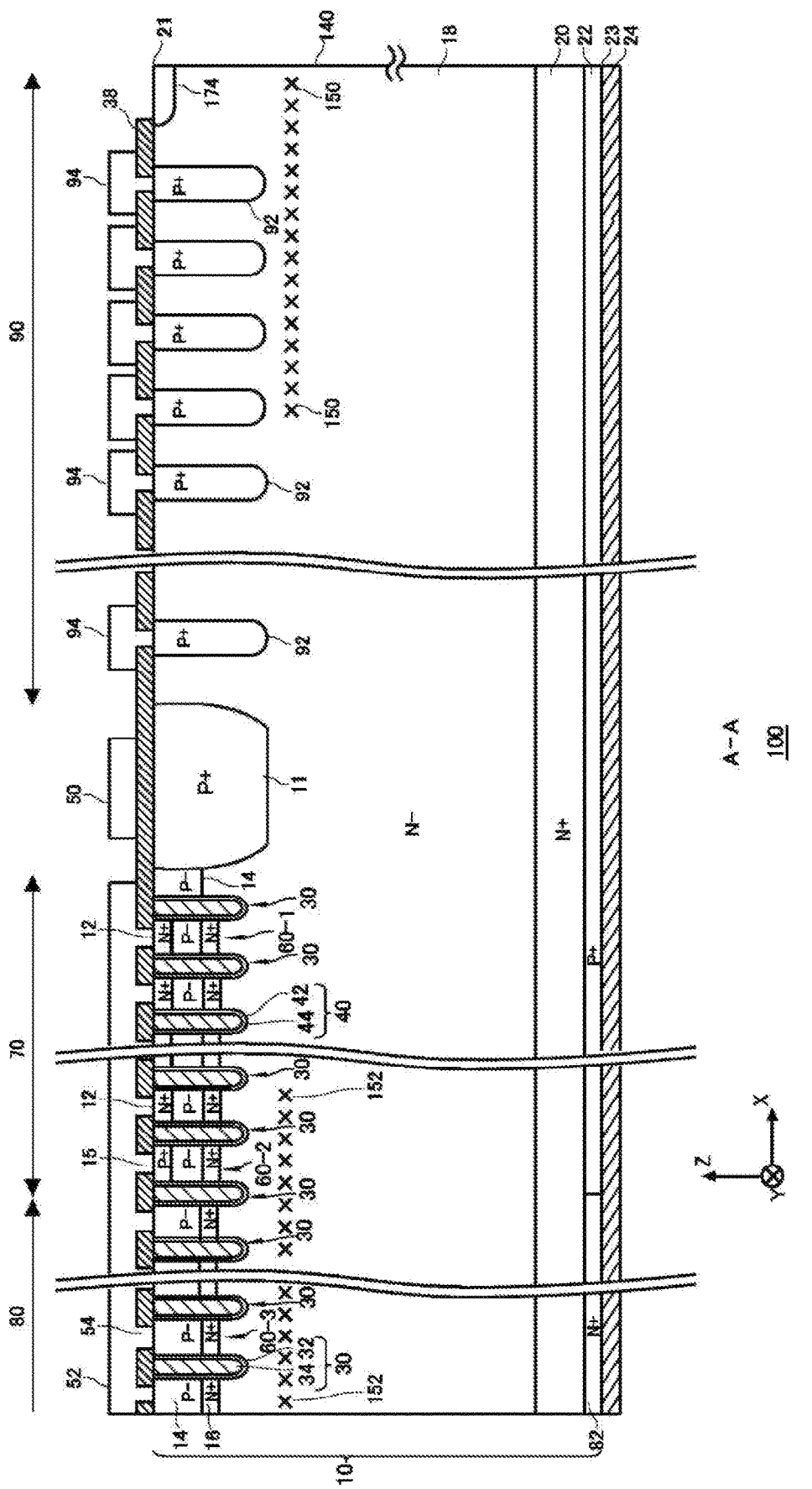
FIG. 4 illustrates one example of a cross section taken along A-A of FIG. 2.

FIG. 4 illustrates one example of a cross section taken along A-A of FIG. 2. The cross section taken along A-A includes the diode section 80, the transistor section 70, and the edge termination structure section 90 and is parallel to an X-Z plane.

The semiconductor device 100 of the present example has, in the cross-section, a semiconductor substrate 10, an interlayer dielectric film 38, an emitter electrode 52 and a collector electrode 24. The interlayer dielectric film 38 covers at least a part of the upper surface of the semiconductor substrate 10. A through hole such as the contact hole 54 is provided in the interlayer dielectric film 38. Through the contact hole 54, the upper surface of the semiconductor substrate 10 is exposed. The interlayer dielectric film 38 may be silicate glass such as PSG or BPSG, and may be an oxide film or a nitride film.

The emitter electrode 52 is provided on the upper surfaces of the semiconductor substrate 10 and the interlayer dielectric film 38 in the transistor section 70 and the diode section 80. The emitter electrode 52 is also provided inside the contact hole 54 and is in contact to the upper surface 21 of the semiconductor substrate 10 exposed through the contact hole 54.

The collector electrode 24 is provided on the lower surface 23 of the semiconductor substrate 10. The collector electrode 24 may be in contact with the entire lower surface 23 of the semiconductor substrate 10. The emitter electrode 52 and the collector electrode 24 are formed of a conductive material such as metal. In the present specification, a direction connecting the emitter electrode 52 and the collector electrode 24 is referred to as the depth direction (Z-axis direction). A direction from the collector electrode 24 toward the emitter electrode 52 is defined as a positive direction of the Z-axis direction.

As described above, the upper end lifetime control unit 150 is provided to the edge termination structure section 90. The upper active section lifetime control unit 152 is provided in the entire diode section 80 and a partial region of the transistor section 70. The upper end lifetime control unit 150 and the upper active section lifetime control unit 152 are arranged closer to the upper surface from the center of the semiconductor substrate 10 in a depth direction perpendicular to the upper surface 21 of the semiconductor substrate 10. The upper end lifetime control unit 150 and the upper active section lifetime control unit 152 may be provided at a position in the semiconductor substrate 10 that is deep from the upper surface 21 by one fourth or less of the thickness of the semiconductor substrate 10. The upper end lifetime control unit 150 and the upper active section lifetime control unit 152 may be provided at a position deeper than a bottom of the trench section or may be provided at a position deeper than a bottom of the well region 11 as seen from the upper surface 21. The upper end lifetime control unit 150 and the upper active section lifetime control unit 152 may be provided at a position having the same depth, or may be provided at a position having a different depth.

The upper end lifetime control unit 150 of the present example is provided at a partial region of the edge termination structure section 90 in the X-axis direction, but may be provided in the entire edge termination structure section 90. Further, the upper end lifetime control unit 150 may be provided in a partial active section 120 (in the present example, transistor section 70).

Provision of the upper end lifetime control unit 150 can suppress a flow of carriers from the edge termination structure section 90 to the active section 120. Further, lifetimes of carriers in the vicinity of the bottom of the trench section such as the diode section 80 are reduced by providing the upper active section lifetime control unit 152. This improves reverse recovery characteristics of the diode section 80. A concentration of carriers in the vicinity of a boundary is suppressed by providing the upper active section lifetime control unit 152 also in the boundary between the transistor section 70 and the diode section 80, and a breakdown resistance such as a turn-off breakdown, a reverse recovery breakdown, and a short-circuit breakdown can be improved.

A plurality of guard rings 92, a plurality of field plates 94 and a channel stopper 174 are provided in the edge termination structure section 90. The interlayer dielectric film 38 covers an upper surface of the guard ring 92. The field plate 94 is formed of a conductive material such as metal or polysilicon and is formed on the interlayer dielectric film 38. The field plate 94 is connected to the guard ring 92 by extending through a through hole provided in the interlayer dielectric film 38.

The channel stopper 174 is exposed at the upper surface 21 and a side surface of the semiconductor substrate 10 at an outer peripheral edge 140. The channel stopper 174 is an N-type region having a higher doping concentration than a drift region 18.

A well region 11 and a gate metal layer 50 are provided between the active section 120 (in the present example, transistor section 70) and the edge termination structure section 90. The well region 11 may be exposed at the upper surface 21 of the semiconductor substrate 10. The interlayer dielectric film 38 covers an upper surface of the well region 11 and the gate metal layer 50 is arranged on the interlayer dielectric film 38. A gate runner 48 is provided on the interlayer dielectric film 38. It is preferable that the well region 11 is provided in a range that is wider the gate metal layer 50 in the X-axis direction.

(P−)-type base regions 14 are provided at the upper surface side of the semiconductor substrate 10 in the diode section 80 and the transistor section 70. The (N−)-type drift region 18 is arranged below the base region 14 in the semiconductor substrate 10. Each trench section is provided from the upper surface of the semiconductor substrate 10 to penetrate the base region 14 and reach the drift region 18.

In each mesa section 60-1 of the transistor section 70 in the cross-section, an (N+)-type emitter region 12, the (P−)-type base region 14, and an (N+)-type accumulation region 16 are arranged in this order from the upper surface side of the semiconductor substrate 10. In the accumulation region 16, donors accumulate at a higher concentration than the drift region 18. The drift region 18 is provided below the accumulation region 16. The accumulation region 16 may be provided to cover the entire lower surface of the base region 14 in each mesa section 60. That is, the accumulation region 16 may be sandwiched by trench sections in the X-axis direction. It is possible to enhance an injection-enhancement effect and reduce an on-voltage in the transistor section 70 by providing, between the drift region 18 and the base region 14, the accumulation region 16 having a higher concentration than the drift region 18.

The contact region 15 is provided to each mesa section 60-1 of the transistor section 70 instead of the emitter region 12 in an X-Z cross section passing through the contact region 15 of the transistor section 70. Further, the contact region 15 is provided in the mesa section 60-2 instead of the emitter region 12. The contact region 15 may function as a latch-up suppression layer to suppress latch-up.

In each mesa section 60-3 of the diode section 80 in the cross section, the (P−)-type base region 14 and the (N+)-type accumulation region 16 are arranged in this order from the upper surface side of the semiconductor substrate 10. The drift region 18 is provided below the accumulation region 16. The diode section 80 may not include the accumulation region 16.

A (P+)-type collector region 22 is provided in a region of the transistor section 70 that is in contact with the lower surface 23 of the semiconductor substrate 10. A (N+)-type cathode region 82 is provided in a region of the diode section 80 that is in contact to the lower surface 23 of the semiconductor substrate 10.

A (N+)-type buffer region 20 is provided between the drift region 18 and the collector region 22 and between the drift region 18 and the cathode region 82 in the semiconductor substrate 10 of the present example. The buffer region 20 has a higher doping concentration than the drift region 18. The buffer region 20 may function as a field stop layer to prevent a depletion layer, expanded from a lower surface side of the base region 14, from reaching a (P+)-type collector region 22 and a (N+)-type cathode region 82.

One or more gate trench sections 40 and one or more dummy trench sections 30 are provided on the upper surface 21 side of the semiconductor substrate 10. Each trench section extends from the upper surface 21 of the semiconductor substrate 10, penetrates the base region 14 and reaches the drift region 18. In the regions where at least any of the emitter region 12, the contact region 15, and the accumulation region 16 is provided, each trench section also reaches the drift region 18 through these regions. A configuration that a trench section penetrates a doping region does not necessarily mean that fabrication is performed in the order of forming a doping region and subsequently forming a trench section. A configuration that is manufactured by forming the trench section and thereafter forming the doping region between the trench sections is also included in the configuration that the trench section penetrates the doping region.

The gate trench section 40 includes a gate trench, a gate insulating film 42, and a gate conductive section 44 provided at the upper surface side of the semiconductor substrate 10. The gate insulating film 42 is provided by covering an inner wall of the gate trench. The gate insulating film 42 may be formed by oxidizing or nitriding semiconductors on the inner wall of the gate trench. The gate conductive section 44 is provided inside the gate trench and at an inner side relative to the gate insulating film 42. That is, the gate insulating film 42 insulates the gate conductive section 44 from the semiconductor substrate 10. The gate conductive section 44 is formed of a conductive material such as polysilicon.

The gate conductive section 44 includes a region that faces the base region 14 across the gate insulating film 42. The gate trench section 40 in the cross-section is covered by the interlayer dielectric film 38 on the upper surface of the semiconductor substrate 10. When a predetermined voltage is applied to the gate conductive section 44, a channel as an inversion layer of electrons is formed in the interfacial surface layer of the base region 14 in contact with the gate trench.

The dummy trench section 30 may have the same structure as the gate trench section 40 in the cross section. The dummy trench section 30 includes a dummy trench, a dummy insulating film 32, and a dummy conductive section 34 provided on the upper surface 21 side of the semiconductor substrate 10. The dummy insulating film 32 is provided to cover an inner wall of the dummy trench. The dummy conductive section 34 is provided inside the dummy trench and provided at an inner side relative to the dummy insulating film 32. The dummy insulating film 32 insulates the dummy conductive section 34 from the semiconductor substrate 10. The dummy conductive section 34 may be formed of the same materials as materials of the gate conductive section 44. For example, the dummy conductive section 34 is formed of a conductive material such as polysilicon. The dummy conductive section 34 may have a length in the depth direction which is the same as that of the gate conductive section 44. The dummy trench section 30 in the cross-section is covered with the interlayer dielectric film 38 on the upper surface 21 of the semiconductor substrate 10. Note that bottoms of the dummy trench section 30 and the gate trench section 40 may have a shape of a curved surface (a curved shape in the cross-section) that is downward convex.

Figure 5:
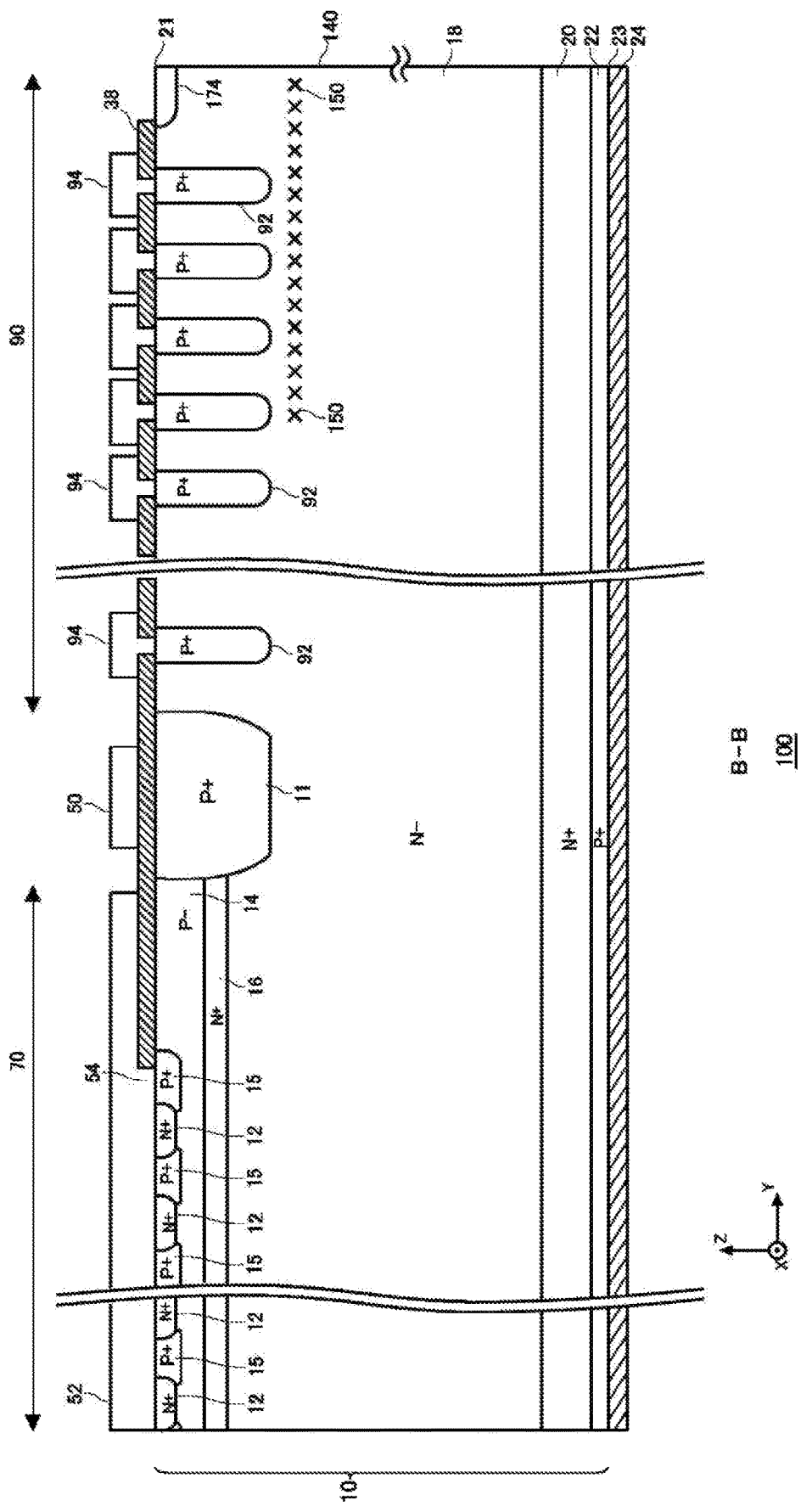
FIG. 5 illustrates one example of a cross section taken along B-B of FIG. 2.

FIG. 5 illustrates one example of a cross section taken along B-B of FIG. 2. The cross section B-B is parallel to a Y-Z plane including a transistor section 70 and an edge termination structure section 90. Structures of the edge termination structure section 90, a gate metal layer 50, and a well region 11 are substantially the same as those of the cross section A-A illustrated in FIG. 4.

The transistor section 70 includes contact regions 15 and emitter regions 12 arranged alternately along a Y-axis direction on an upper surface of a semiconductor substrate 10. The contact regions 15 and the emitter regions 12 are continuous to an emitter electrode 52 trough contact holes 54. A base region 14 is provided between a contact region 15 that is closest to the well region 11 and the well region 11 in the Y-axis direction. An interlayer dielectric film 38 covers an upper surface of the base region 14. The base region 14 is also provided below the contact regions 15 and the emitter regions 12. An accumulation region 16 is provided between the base region 14 and a drift region 18.

As described above, an edge termination structure section 90 includes an upper end lifetime control unit 150. The transistor section 70 in the cross section does not include an upper active section lifetime control unit 152.

The upper end lifetime control unit 150 of the present example is provided in only a partial region of the edge termination structure section 90 in the Y-axis direction, but may be provided in the entire edge termination structure section 90. The upper end lifetime control unit 150 may be provided in a part of an active section 120 (transistor section 70 in the present example).

Provision of the upper end lifetime control unit 150 can suppress a flow of carriers from the edge termination structure section 90 to the active section 120. No provision of the upper active section lifetime control unit 152 in the transistor section 70 can suppress a leakage current in the transistor section 70 caused by the upper active section lifetime control unit 152.

Figure 6:
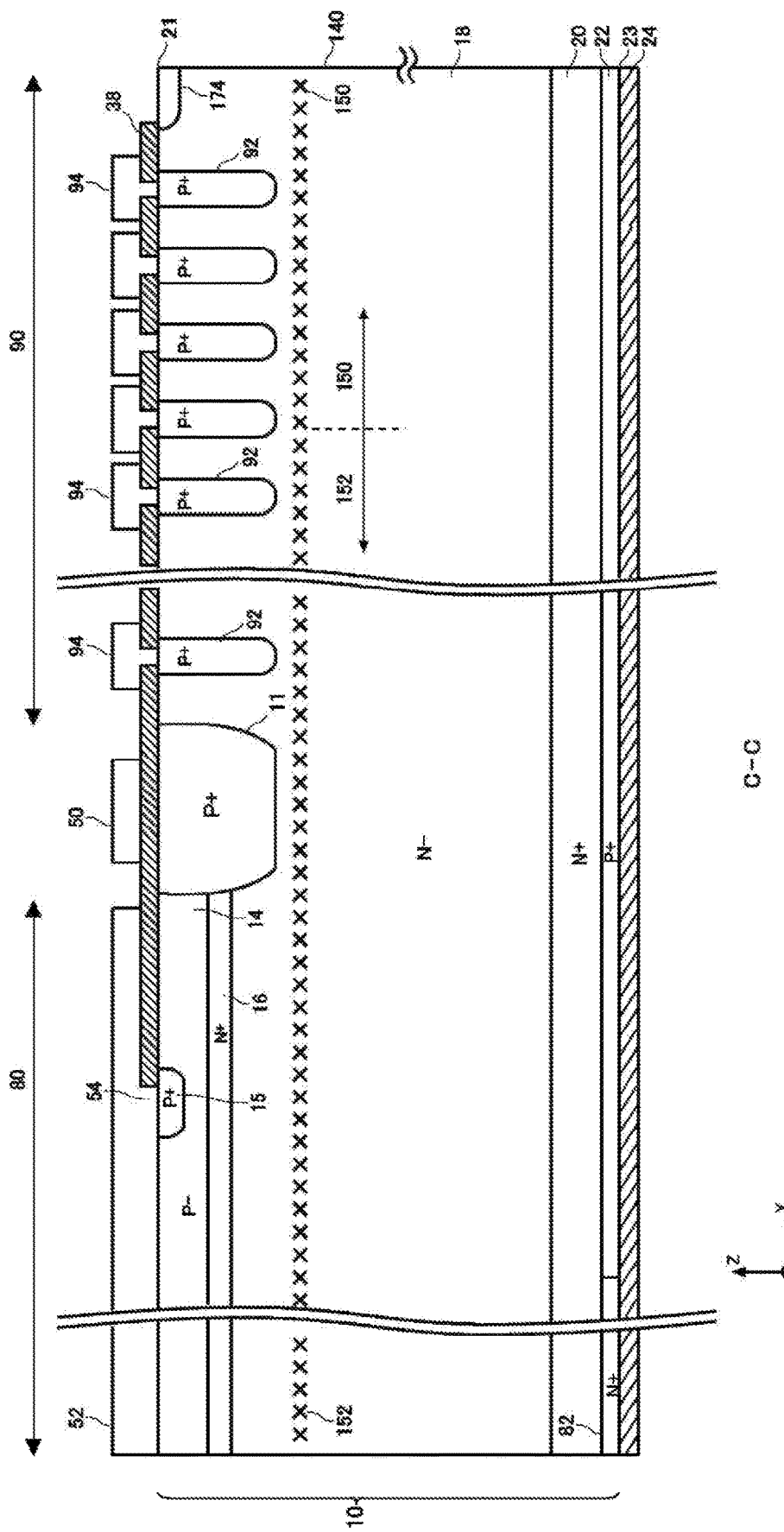
FIG. 6 illustrates one example of a cross section taken along C-C of FIG. 2.

FIG. 6 illustrates one example of a cross section taken along C-C of FIG. 2. The cross section C-C is parallel to a Y-Z plane including a diode section 80 and an edge termination structure section 90. Structures of the edge termination structure section 90, a gate metal layer 50, and a well region 11 are approximately the same as those of the cross section A-A illustrated in FIG. 4.

The diode section 80 includes a base region 14 along the Y-axis direction on an upper surface of a semiconductor substrate 10. A contact region 15 may be provided below an end portion of a contact hole 54 in the Y-axis direction. An interlayer dielectric film 38 covers the base region 14 between the contact region 15 and the well region 11. An accumulation region 16 is provided between the base region 14 and a drift region 18.

As described above, an upper end lifetime control unit 150 is provided to the edge termination structure section 90. An upper active section lifetime control unit 152 is provided to a diode section 80.

The upper end lifetime control unit 150 and the upper active section lifetime control unit 152 are continuous in a top view of the semiconductor substrate 10. In an example of FIG. 6, the upper end lifetime control unit 150 and the upper active section lifetime control unit 152 are provided at a position having the same depth. In another example, the upper end lifetime control unit 150 and the upper active section lifetime control unit 152 may be provided at a position having different depths. In this case, an end portion of the upper end lifetime control unit 150 and an end portion of the upper active section lifetime control unit 152 may overlap each other. For example, the upper active section lifetime control unit 152 may be provided further apart from the upper surface 21 than the upper end lifetime control unit 150. This can suppress a leakage current caused by the upper active section lifetime control unit 152. Alternatively, the upper end lifetime control unit 150 may be provided further apart from the upper surface 21 than the upper active section lifetime control unit 152. This can further suppress a flow of carriers from a lower surface 23 side of the edge termination structure section 90 to an upper surface 21 side of an active section 120.

Figure 7:
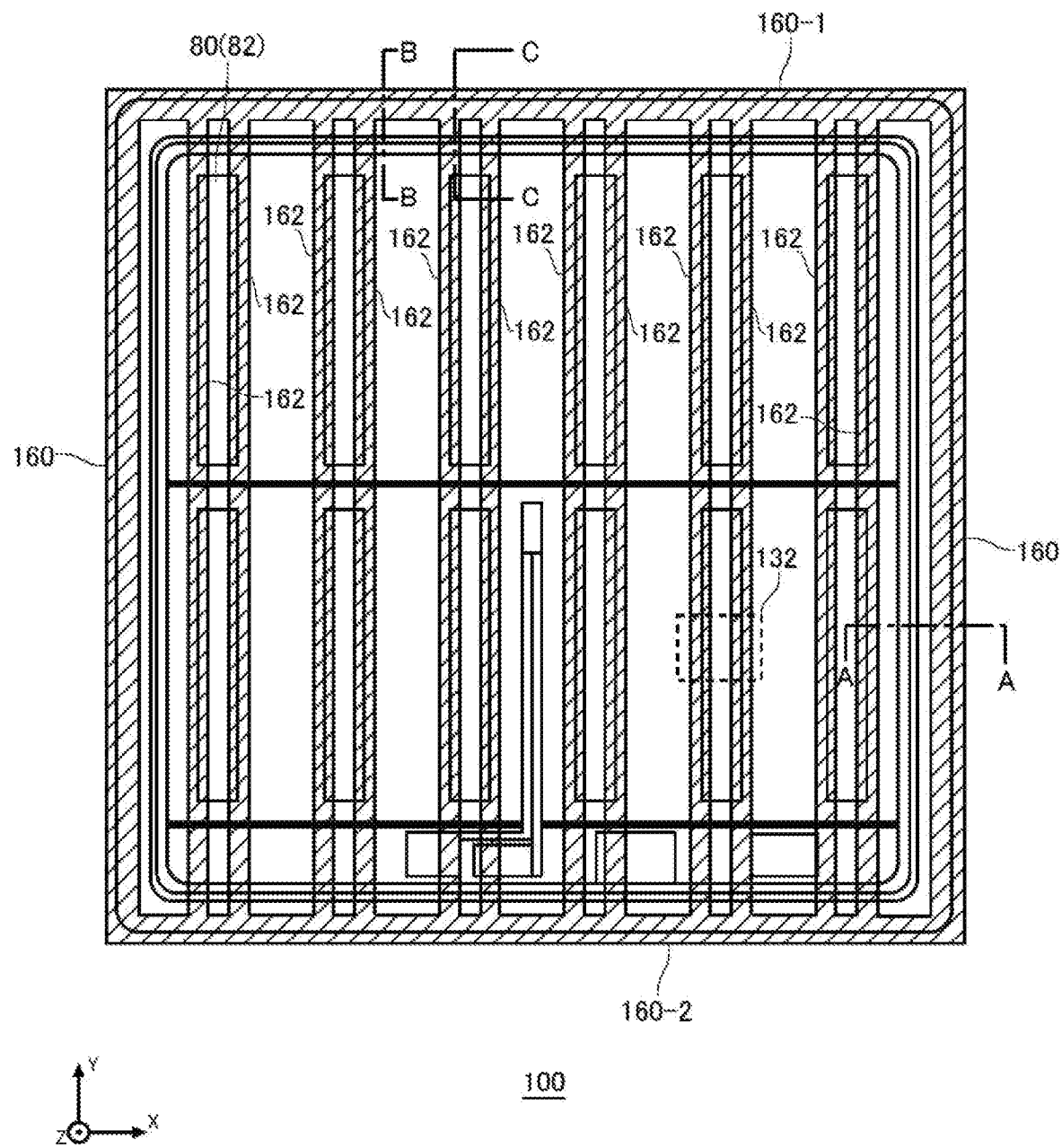
FIG. 7 illustrates an exemplary arrangement of a lifetime control unit provided in a semiconductor substrate 10.

FIG. 7 illustrates an exemplary arrangement of a lifetime control unit in a semiconductor substrate 10. A region provided with the lifetime control unit in FIG. 7 is represented by a top view indicated with hatch lines of FIG. 1. In FIG. 7, some of reference numerals in FIG. 1 are omitted.

FIG. 7 illustrates each lower end lifetime control unit 160 as one example of an end lifetime control unit. The lower end lifetime control unit 160 is provided in the semiconductor substrate 10 in an edge termination structure section 90. The lower end lifetime control unit 160 is arranged between a center and a lower surface of the semiconductor substrate 10 in a Z-axis direction.

The lower end lifetime control unit 160 is continuous in a range facing at least two or more diode sections 80 in the X-axis direction. This can reduce carriers passing from the edge termination structure section 90 to an emitter region of a transistor section 70 at a time of turn-off of a semiconductor device 100 (that is, at a time of turn-off of transistor section 70). Therefore, a turn off withstand capability of the semiconductor device 100 is improved.

In an example of FIG. 7, the lower end lifetime control unit 160 is provided in a circular pattern to surround an active section 120 on a plane parallel to an upper surface of a semiconductor substrate 10. This can further reduce carriers passing from the edge termination structure section 90 to the emitter region of the transistor section 70. Each lower end lifetime control unit 160 may be apart from the active section 120 on the upper surface of the semiconductor substrate 10. The lower end lifetime control unit 160 may be arranged to partially overlap a cathode region 82 but not entirely overlap the cathode region 82. This can suppress a movement of carriers from the edge termination structure section 90 to the active section 120 while reducing an influence on characteristics of the diode section 80.

FIG. 7 illustrates each lower active section lifetime control unit 162 as one example of an active section lifetime control unit. The semiconductor device 100 may include a lower side lifetime control unit illustrated in FIG. 7 in addition to an upper side lifetime control unit illustrated in FIG. 1 to FIG. 6, or may include a lower side lifetime control unit without having an upper side lifetime control unit. The lower active section lifetime control unit 162 is provided in the semiconductor substrate 10 in the active section 120. The lower active section lifetime control unit 162 is arranged between a center and the lower surface of the semiconductor substrate 10 in the Z-axis direction.

At least a part of the lower active section lifetime control unit 162 of the present example overlaps with the diode section 80 and the transistor section 70. However, a part of the diode section 80 and a part of the transistor section 70 do not overlap the lower active section lifetime control unit 162. More specifically, each lower active section lifetime control unit 162 is provided in the vicinity of a boundary between each diode section 80 and each transistor section 70 in the X-axis direction. That is, the lower active section lifetime control unit 162 is provided to two end portions of each diode section 80 in the X-axis direction. However, each lower active section lifetime control unit 162 does not overlap a center region of each diode section 80 in the X-axis direction.

The lower active section lifetime control unit 162 is continuous with the lower end lifetime control unit 160 within a plane parallel to the upper surface of the semiconductor substrate 10 in a second direction. Each lower active section lifetime control unit 162 traverses the active section 120 in the Y-axis direction. In this case, the lower active section lifetime control unit 162 is provided such that lower end lifetime control units 160-1 and 160-2 facing in the Y-axis direction are connected among the lower end lifetime control unit 160.

The lower active section lifetime control unit 162 is not provided in at least a partial region of the transistor section 70 on the upper surface of the semiconductor substrate 10. Each lower active section lifetime control unit 162 and each lower end lifetime control unit 160 do not have to be continuous in the X-axis direction. That is, a region is present where no lower side lifetime control unit is provided between each lower active section lifetime control unit 162 and each lower end lifetime control unit 160. The region is above the transistor section 70 provided at an end portion of the active section 120 in the X-axis direction. That is, the lower end lifetime control unit 160 and the lower active section lifetime control unit 162 are arranged so as not to overlap at least a part the transistor section 70 provided at the end portion of the active section 120.

Figure 8A:
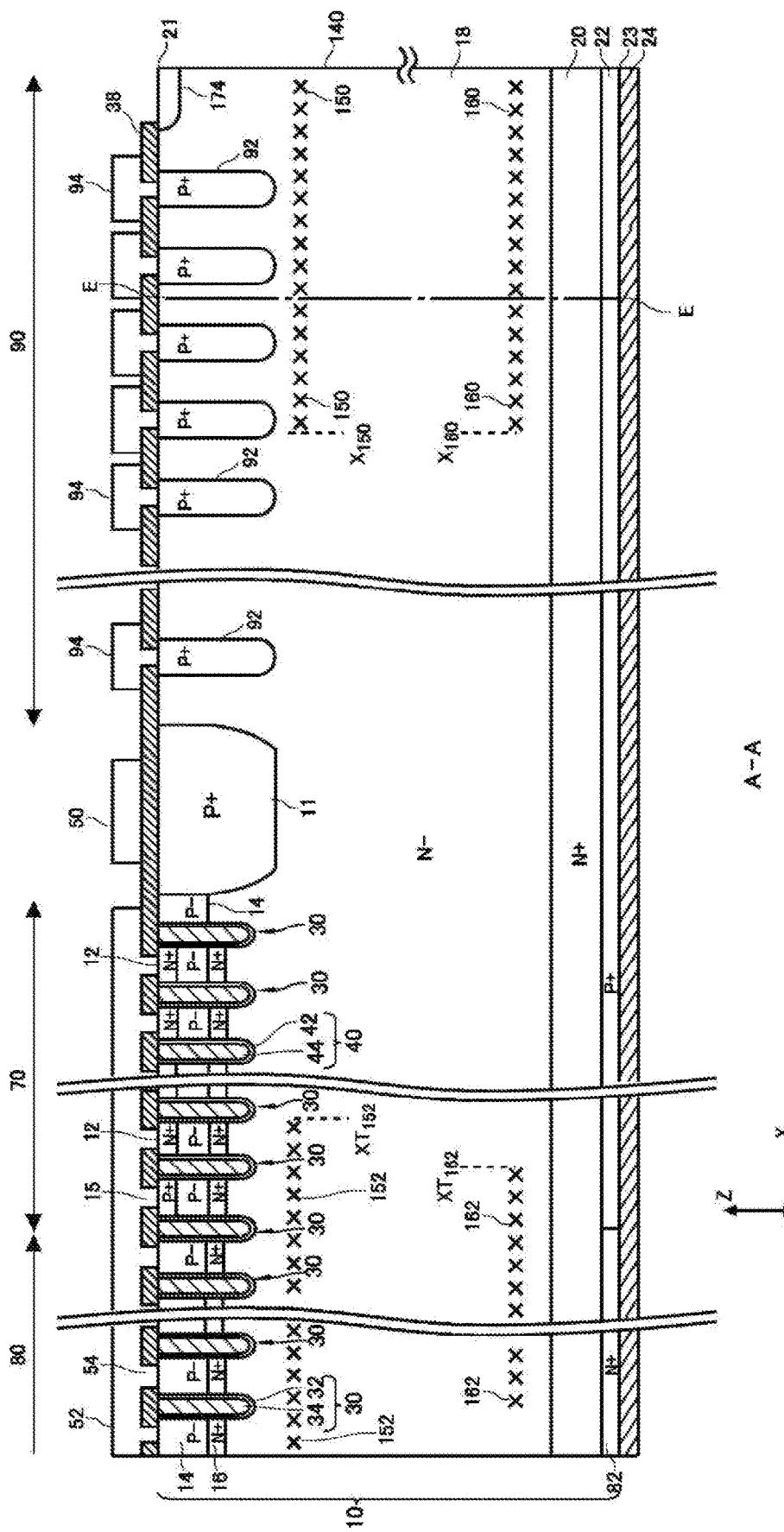
FIG. 8A illustrates one example of a cross section taken along A-A of FIG. 7.

FIG. 8A illustrates one example of a cross section taken along A-A of FIG. 7. A semiconductor device 100 of the present example includes an upper side lifetime control unit and a lower side lifetime control unit. The cross section A-A is parallel to an X-Z plane including a diode section 80, a transistor section 70, and an edge termination structure section 90. A structure of the upper side lifetime control unit is similar to that of FIG. 4.

As described above, lower end lifetime control unit 160 is provided to the edge termination structure section 90. The lower active section lifetime control unit 162 is provided in a partial region of the diode section 80 and a partial region of the transistor section 70. The lower end lifetime control unit 160 and the lower active section lifetime control unit 162 are arranged below the center in a semiconductor substrate 10 in a depth direction perpendicular to an upper surface 21 of the semiconductor substrate 10. The lower end lifetime control unit 160 and the lower active section lifetime control unit 162 may be provided to a position above the lower surface 23 of the semiconductor substrate 10 by one fourth or less of a thickness of the semiconductor substrate 10. The lower end lifetime control unit 160 and the lower active section lifetime control unit 162 may be provided at a position having the same depth or at a position having different depths.

The lower end lifetime control unit 160 of the present example is provided only in a partial region of the edge termination structure section 90, but may be provided in an entire region of the edge termination structure section 90 in the X-axis direction. The lower end lifetime control unit 160 may also be provided in a part of the active section 120 (in the present example, transistor section 70).

Provision of the lower end lifetime control unit 160 can efficiently suppress a flow of carriers from the edge termination structure section 90 to the active section 120. Provision of the lower active section lifetime control unit 162 can improve leakage current characteristics caused by the upper active section lifetime control unit 152. Provision of the lower active section lifetime control unit 162 allows cancelling out between holes of a small number of carriers generated in a drift region 18 and electrons of a large number of carriers during a short lifetime. This can improve leakage current characteristics of the transistor section 70. Further, this can improve a tradeoff between an on-voltage and a turn-on loss of the transistor section 70.

A farthest end portion position $X_{150}$ of the upper end lifetime control unit 150 and a farther end portion position $X_{160}$ of the lower end lifetime control unit 160 may be the same in the X-axis direction. In another example, the farthest end portion position $X_{150}$ may be arranged closer to the active section 120 side than the farthest end portion position $X_{160}$. That is, the upper end lifetime control unit 150 may be provided in a wide range closer to the active section 120 side than the lower end lifetime control unit 160 in the X-axis direction.

In another example, the end portion position $X_{150}$ may be arranged closer to a periphery 140 side of the semiconductor substrate 10 than the end portion position $X_{160}$. This allows arranging each upper end lifetime control unit 150 that may cause a leakage current far from the transistor section 70 while suppressing carriers flowing from a lower surface 23 side of the edge termination structure section 90 to an upper surface 21 side of the active section 120.

A farthest end portion position of the upper active section lifetime control unit 152 in the transistor section 70 in the X-axis direction (farthest end portion position of X-axis positive side) is defined as $XT_{152}$. A farthest end portion position of the lower active section lifetime control unit 162 in the transistor section 70 in the X-axis direction (farthest end portion position of X-axis positive side) is defined as $XT_{162}$.

The farthest end portion position $XT_{162}$ may be arranged closer to the diode section 80 side (X-axis negative side) than the farthest end portion position $XT_{152}$. That is, a length of each lower active section lifetime control unit 162 in the transistor section 70 is smaller than a length of each upper active section lifetime control unit 152 in the transistor section 70. This can suppress implantation of holes from an emitter region 12 of the transistor section 70 to a cathode region 82 of the diode section 80 during an operation of the diode section 80. Therefore, it is possible to improve reverse recovery characteristics of the diode section 80.

Figure 8B:
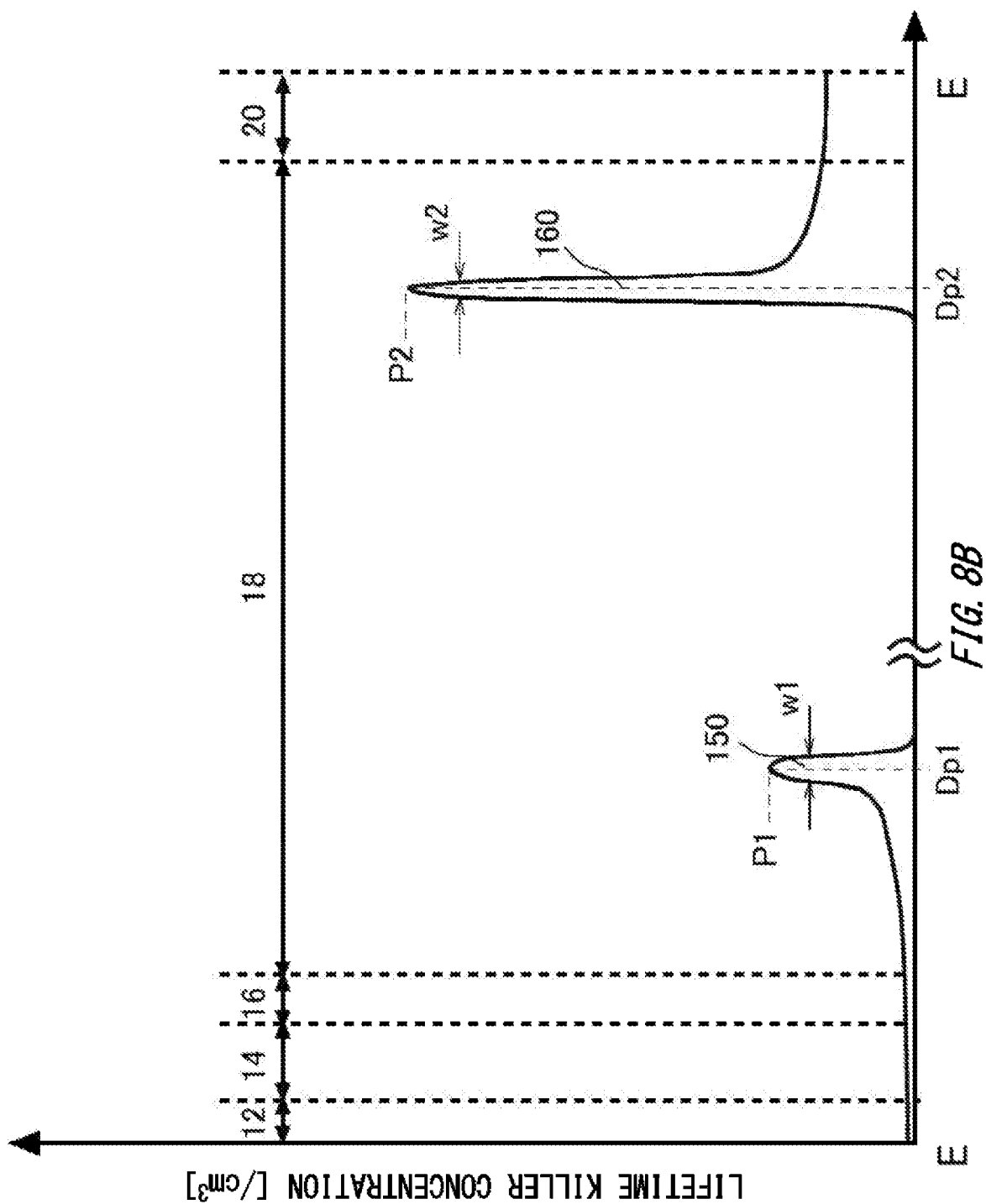
FIG. 8B illustrates one example of a lifetime killer concentration distribution of an upper end lifetime control unit 150 and a lower end lifetime control unit 160 in a cross section taken along E-E of FIG. 8A.

FIG. 8B illustrates one example of lifetime killer concentration distributions of an upper end lifetime control unit 150 and a lower end lifetime control unit 160 in a cross section taken along E-E of FIG. 8A. An upper active section lifetime control unit 152 may have a similar lifetime killer concentration distribution as the upper end lifetime control unit 150. A lower active section lifetime control unit 162 may have a similar lifetime killer concentration distribution as the lower end lifetime control unit 160.

The upper end lifetime control unit 150 is formed by irradiation with helium ion from the upper surface side. The lower end lifetime control unit 160 is formed by irradiation with helium ion from the lower surface side. In each figure of the present specification, a peak position of a lifetime killer concentration in a killer region is indicated by a sign×. When irradiating a unit with helium ion or the like from the upper surface side, on the upper surface side from the peak position, a lifetime killer having a lower concentration than the peak concentration (tail portion in concentration distribution of lifetime killer) may be distributed.

When irradiating a unit with helium ion from the lower surface side, on the lower surface side from the peak position, a lifetime killer having a lower concentration than the peak concentration may be distributed. A peak concentration of a lifetime killer concentration of the lower end lifetime control unit 160 may be higher or lower than a peak concentration of a lifetime killer concentration of the upper end lifetime control unit 150. The lifetime killer concentration of the lower end lifetime control unit 160 may be higher than the lifetime killer concentration of the upper end lifetime control unit 150 in a range from twice or more to 5 times or less.

A width w1 of the lifetime killer concentration distribution of the upper end lifetime control unit 150 may be larger than a width w2 of the lifetime killer concentration distribution of the lower end lifetime control unit 160. The w1 and w2 may be Full Width at Half Maximum (FWHM) of a peak concentration P1 or a peak concentration P2. Alternatively, the widths w1 and w2 may be full width at 10% of maximum (F10% WHM) of the peak concentration P1 or the peak concentration P2. Alternatively, the widths w1 and w2 may be full width at 1% of maximum of the peak concentration P1 and the peak concentration P2.

When the width w1 is larger than the width w2, a distance from an upper surface 21 to a depth position Dp1 having the peak concentration P1 may be larger than a distance from a lower surface 23 to a depth position Dp2 having the peak concentration P2. Reversely, when the width w1 is smaller than the width w2, the distance from the upper surface 21 to the depth position Dp1 having the peak concentration P1 may be smaller than the distance from the lower surface 23 to the depth position Dp2 having the peak concentration P2. When a position having a peak concentration is a deep position, a concentration distribution of a recombination center can be made gentle by forming a lifetime control region to have a large width in a depth direction of a semiconductor substrate 10. This can prevent a rapid increase in a leakage current due to an increase in an applied voltage.

A concentration distribution of lifetime killer indicated on a vertical axis of FIG. 8B may be a helium concentration or a crystal defect density formed by an irradiation with helium. A crystal defect may be helium between the lattice, vacancies, divacancies or the like. Due to these crystal defects, the recombination center of the carriers is formed. The recombination of the carriers is facilitated through an energy level (trap level) of the formed energy recombination center. A lifetime killer concentration corresponds to a trap level density.

In the present example, by setting a lifetime killer concentration of a lower side lifetime control unit to be higher than a lifetime killer concentration of an upper side lifetime control unit, an entire lifetime killer concentration can be increased while maintaining a lifetime killer concentration of an upper side contributing to a leakage current. This can adjust a tradeoff between an on-voltage and a turn-off loss of a transistor section 70 while maintaining leakage current characteristics of the transistor section 70.

Figure 9:
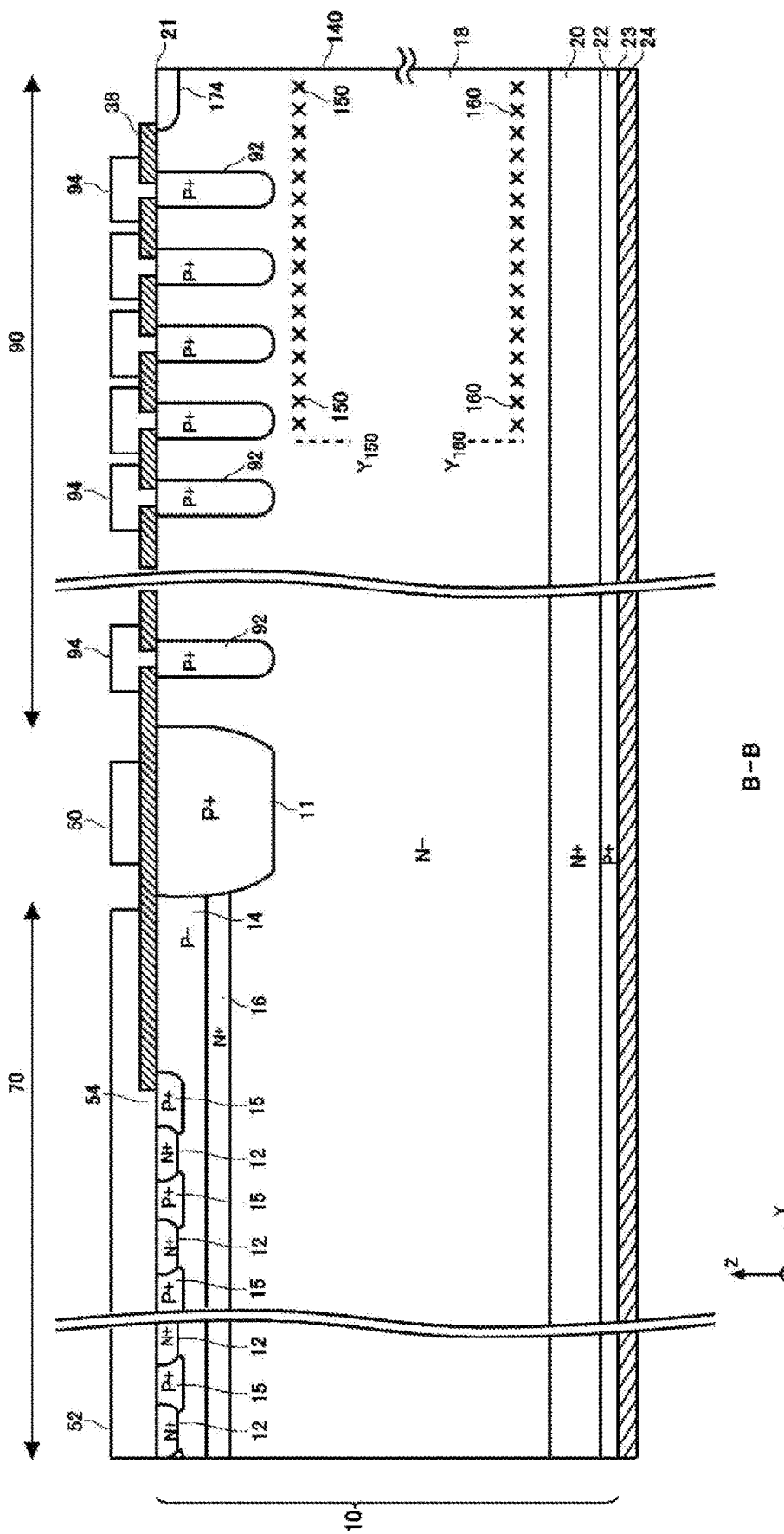
FIG. 9 illustrates one example of a cross section taken along B-B of FIG. 7.

FIG. 9 illustrates one example of a cross section taken along B-B of FIG. 7. As described above, lower end lifetime control unit 160 is provided in an edge termination structure section 90. A transistor section 70 in the cross section does not include a lower active section lifetime control unit 162.

In the present example, the lower end lifetime control unit 160 is provided only in a partial region of the edge termination structure section 90 in the Y-axis direction, but may be provided in an entire region of the edge termination structure section 90. Further, the lower end lifetime control unit 160 may be provided also in a partial region of an active section 120 (in the present example, transistor section 70). Provision of lower end lifetime control unit 160 can effectively suppress a flow of carriers from the edge termination structure section 90 to the active section 120.

A farthest end portion position $Y_{150}$ of upper end lifetime control unit 150 and a farthest end portion position $Y_{160}$ of the lower end lifetime control unit 160 in the Y-axis direction may be the same. In another example also, the end portion position $Y_{150}$ may be arranged closer to the active section 120 side than the end portion position $Y_{130}$. That is, the upper end lifetime control unit 150 may be provided in a wide range closer to the active section 120 side than the lower end lifetime control unit 160 in the Y-axis direction.

In another example, the end portion position $Y_{150}$ may be arranged closer to a periphery 140 side of a semiconductor substrate 10 than the end portion position $Y_{130}$. This allows arranging the upper end lifetime control unit 150 that may cause a leakage current far from the transistor section 70 while suppressing carriers flowing from a lower surface 23 side of the edge termination structure section 90 to an upper surface 21 side of the active section 120.

Figure 10:
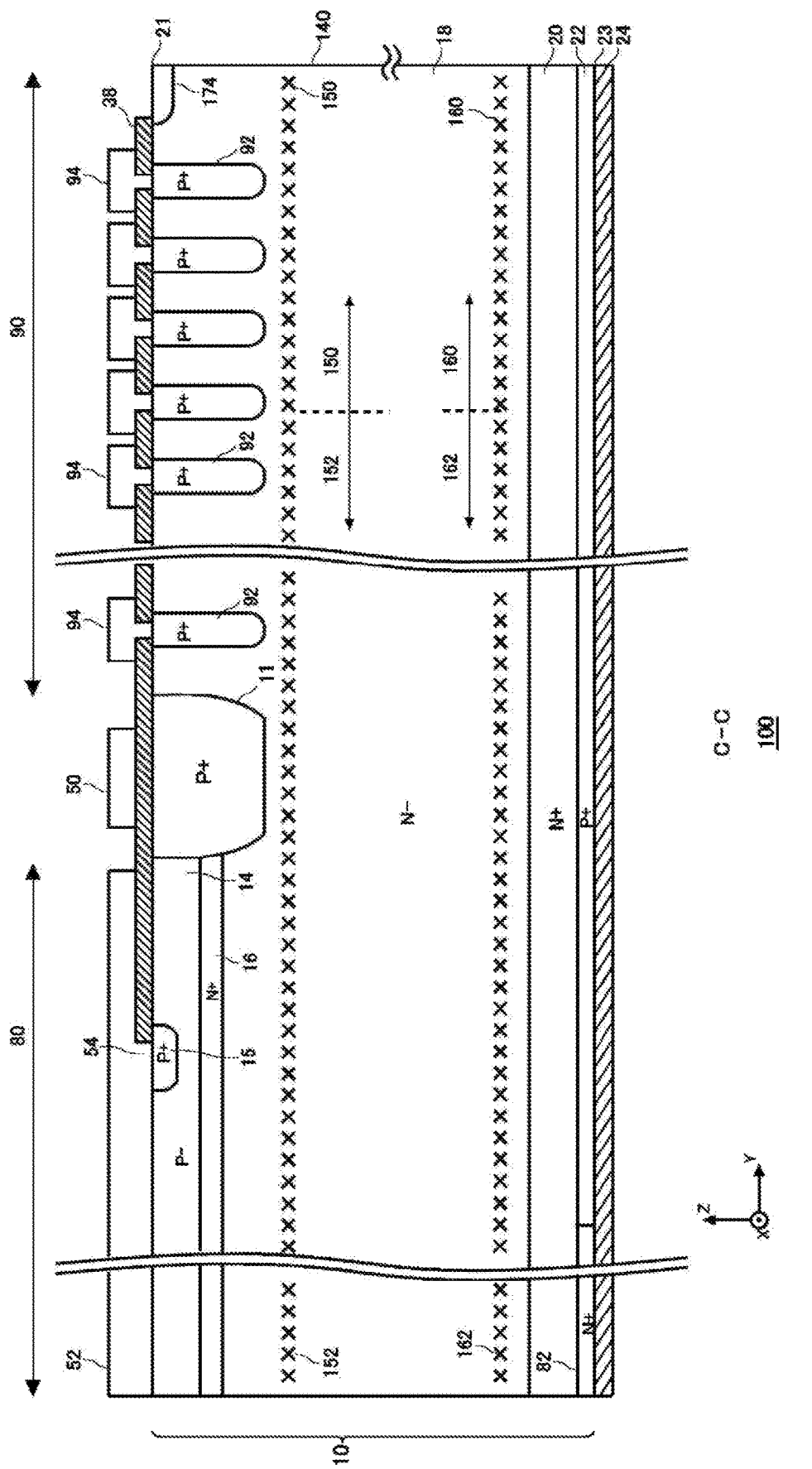
FIG. 10 illustrates one example of a cross section taken along C-C of FIG. 7.

FIG. 10 illustrates one example of a cross section taken along C-C of FIG. 7. As described above, lower end lifetime control unit 160 is provided in an edge termination structure section 90. A lower active section lifetime control unit 162 is provided in a diode section 80.

The lower end lifetime control unit 160 and the lower active section lifetime control unit 162 are continuous in top view of a semiconductor substrate 10. In an example of FIG. 10, the lower end lifetime control unit 160 and the lower active section lifetime control unit 162 are provided at a position having the same depth. In another example, the lower end lifetime control unit 160 and the lower active section lifetime control unit 162 are provided at a position having different depths. In this case, a farthest end portion of the lower end lifetime control unit 160 and a farthest end portion of the lower active section lifetime control unit 162 may overlap each other. For example, the lower end lifetime control unit 160 may be closer to a lower surface 23 than the lower active section lifetime control unit 162. This makes it easy to reduce carriers flowing from a lower surface 23 side of the edge termination structure section 90 to an upper surface 21 side of an active section 120.

Figure 11:
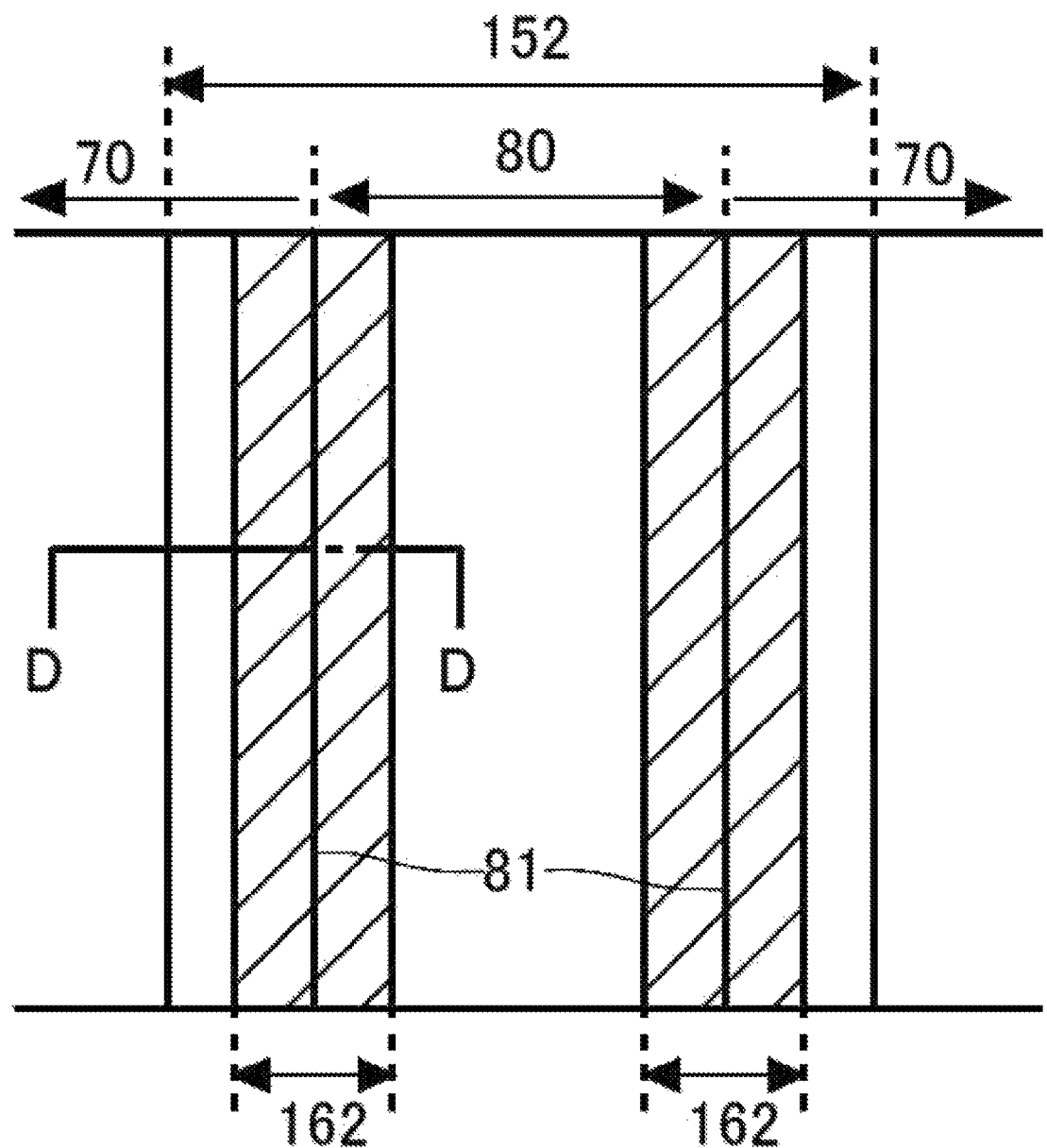
FIG. 11 is an enlarged view of a region 132 in FIG. 7.

FIG. 11 is an enlarged view of a region 132 in FIG. 7. The region 132 includes a diode section 80 and transistor sections 70 arranged at both sides of the diode section 80 in the X-axis direction.

As described above, an upper active section lifetime control unit 152 is provided in a range wider than the diode section 80 in the X-axis direction. A lower active section lifetime control unit 162 overlaps with respective end portions 81 of the diode section 80 in the X-axis direction, overlap parts of the diode section 80 contacting to the end portions 81, and overlap parts of the transistor sections 70 contacting to the end portions 81. A length in which the upper active section lifetime control unit 152 overlaps with the transistor sections 70 in the X-axis direction is larger than a length in which the lower active section lifetime control unit 162 overlaps with the transistor sections 70 in the X-axis direction. The lower active section lifetime control unit 162 may overlap a pn junction between a cathode region 82 and a collector region 22 in a top view.

Figure 12:
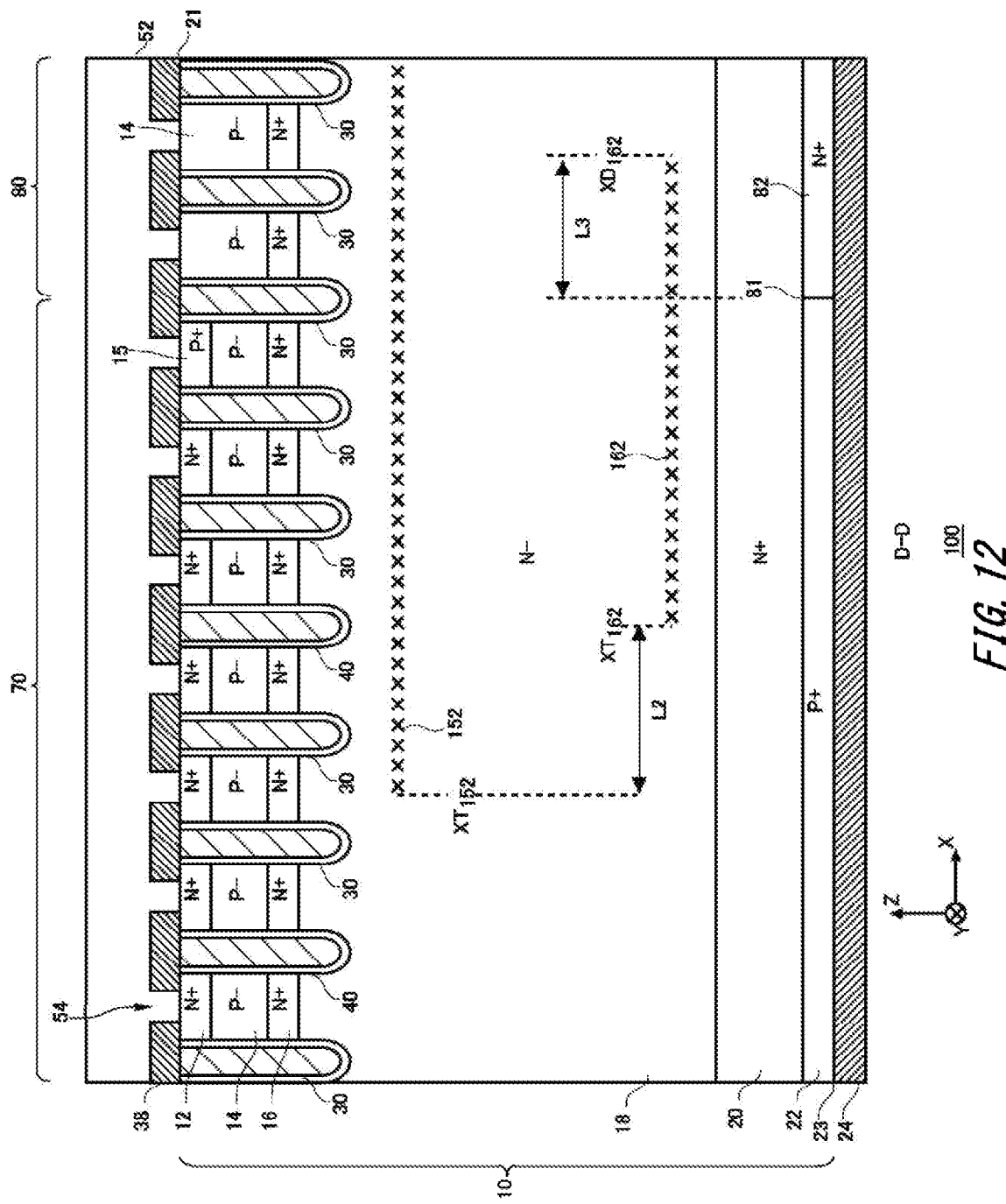
FIG. 12 illustrates a cross section taken along D-D of FIG. 11.

FIG. 12 illustrates a cross section taken along D-D of FIG. 11. The cross section D-D is an X-Z plane including a transistor section 70 and a diode section 80. As described above, an upper active section lifetime control unit 152 is provided in an entire region of the diode section 80 and a partial region of the transistor section 70 in the X-axis direction. A farthest end portion position of the upper active section lifetime control unit 152 in the X-axis direction is defines as $XT_{152}$.

The lower active section lifetime control unit 162 is provided in a partial region of the diode section 80 and a partial region of the transistor section 70 at both sides of an end portion 81. A farthest end portion position of the lower active section lifetime control unit 162 in the transistor section 70 in the X-axis direction is defined as $XT_{162}$ and a farthest end portion position in the diode section 80 in the X-axis direction is defined as $XD_{162}$.

A distance L2 between the farthest end portion position $XT_{152}$ and the farthest end portion position $XT_{162}$ in the X-axis direction may be 50 µm or more to 100 µm or less as described above. A distance L3 between the end portion 81 and the farthest end portion position $XD_{162}$ in the X-axis direction is 10 µm or more to 20 µm or less as one example.

Figure 13:
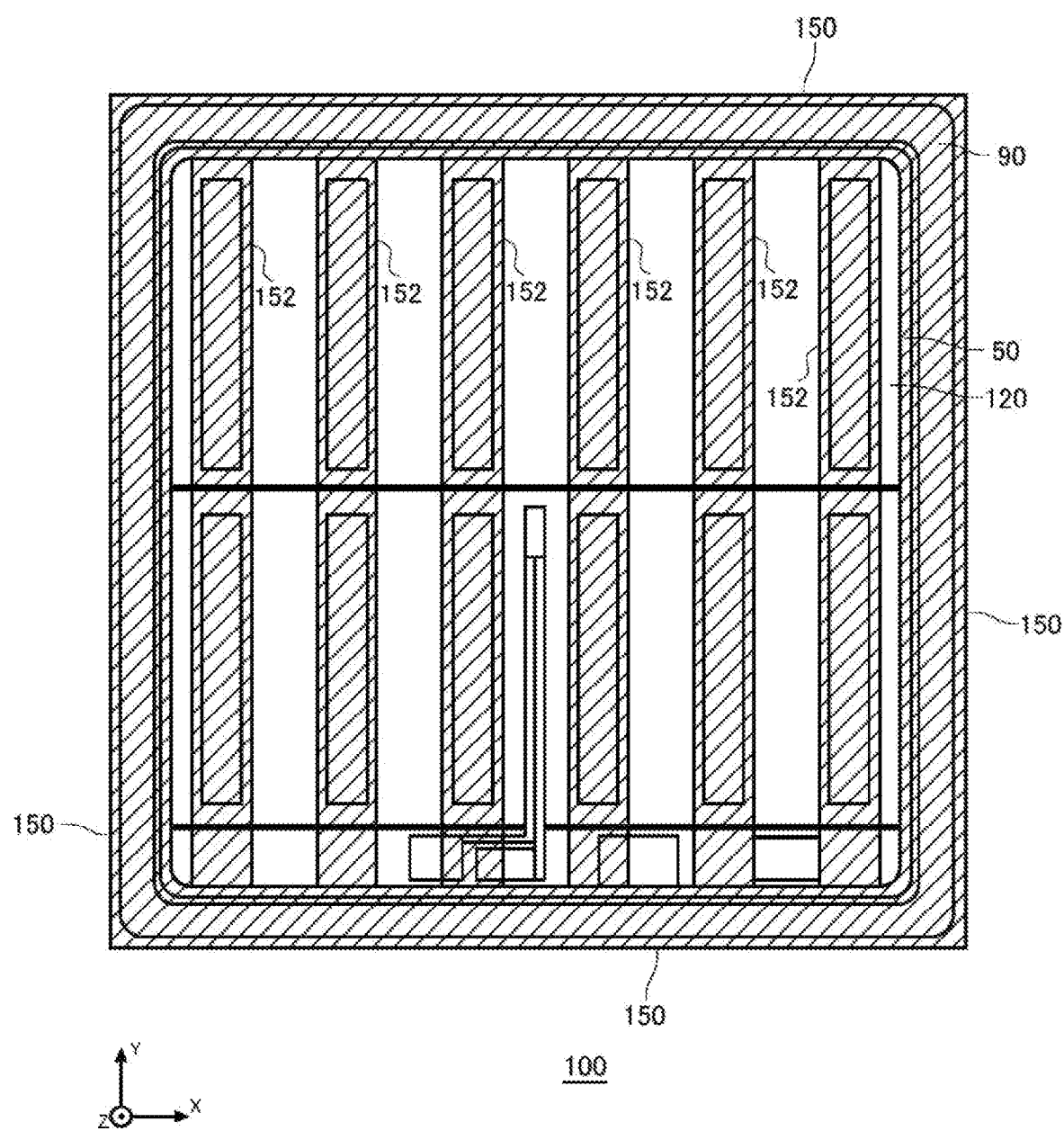
FIG. 13 illustrates another example of an upper end lifetime control unit 150.

FIG. 13 illustrates another example of an upper end lifetime control unit 150. The upper end lifetime control unit 150 of the present example overlaps with an entire region of an edge termination structure section 90 in top view of a semiconductor substrate 10. The upper end lifetime control unit 150 may overlap at least a part of a gate metal layer 50, may overlap an entire region of the gate metal layer 50, or may overlap a partial region of an active section 120. The upper end lifetime control unit 150 of the present example may be applied to a semiconductor device 100 of each aspect illustrated in FIGS. 1 to 12.

Figure 14:
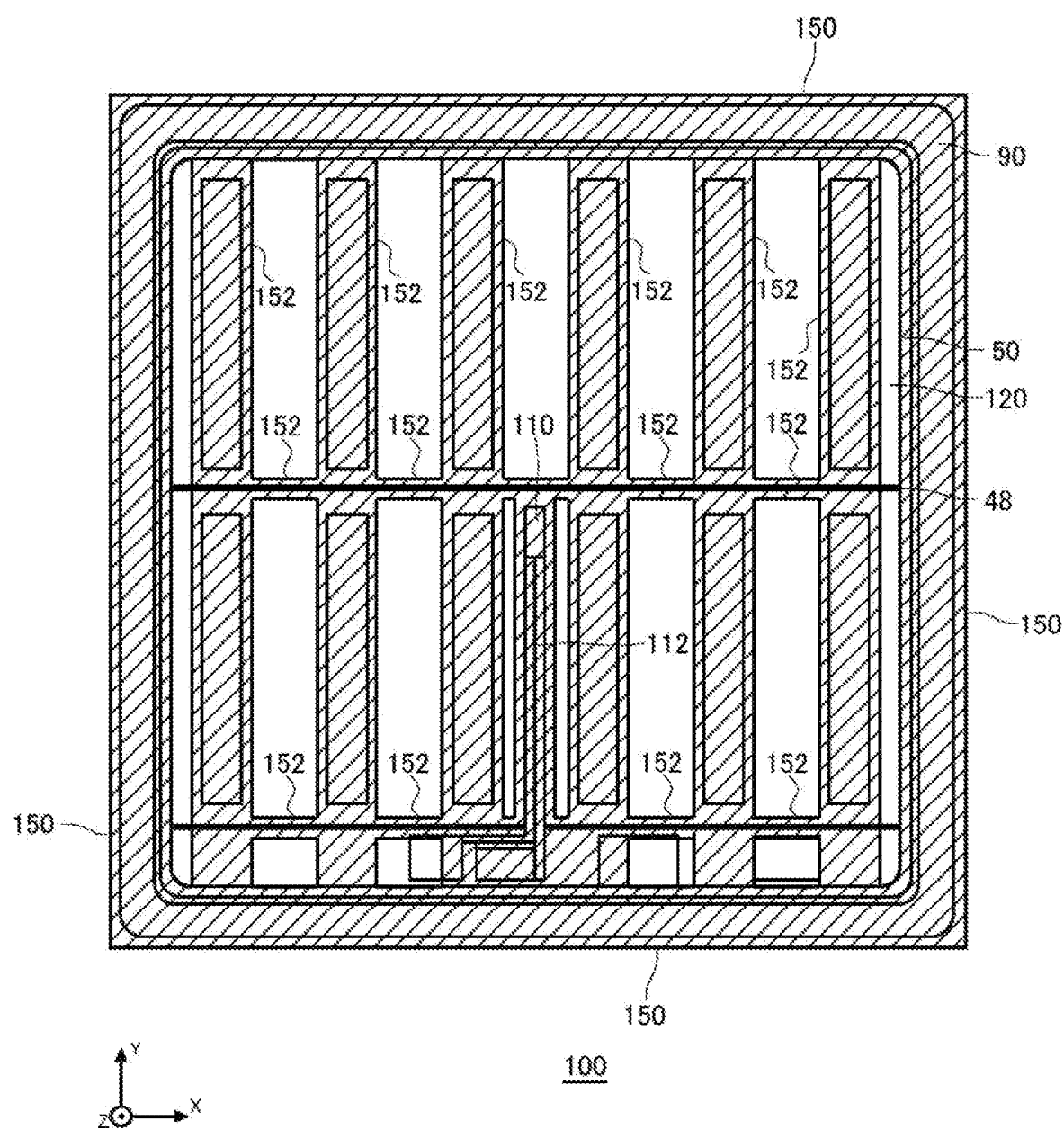
FIG. 14 illustrates another example of an upper active section lifetime control unit 152.

FIG. 14 illustrates another example of an upper active section lifetime control unit 152. The upper active section lifetime control unit 152 of the present example is provided below at least a partial region of a gate runner 48, a temperature-sensing section 110, and a temperature-sensing wire 112 in top view of a semiconductor substrate 10. The upper active section lifetime control unit 152 may be provided below entire regions of the gate runner 48, the temperature-sensing section 110, and the temperature-sensing wire 112. The upper active section lifetime control unit 152 may overlap an entire well region 11 provided in the semiconductor substrate 10. This configuration can also suppress a movement of carriers from below the well region 11 or the like to a transistor section 70 and a diode section 80. The upper active section lifetime control unit 152 of the present example may be applied to a semiconductor device 100 of each aspect illustrated in FIGS. 1 to 13.

Figure 15:
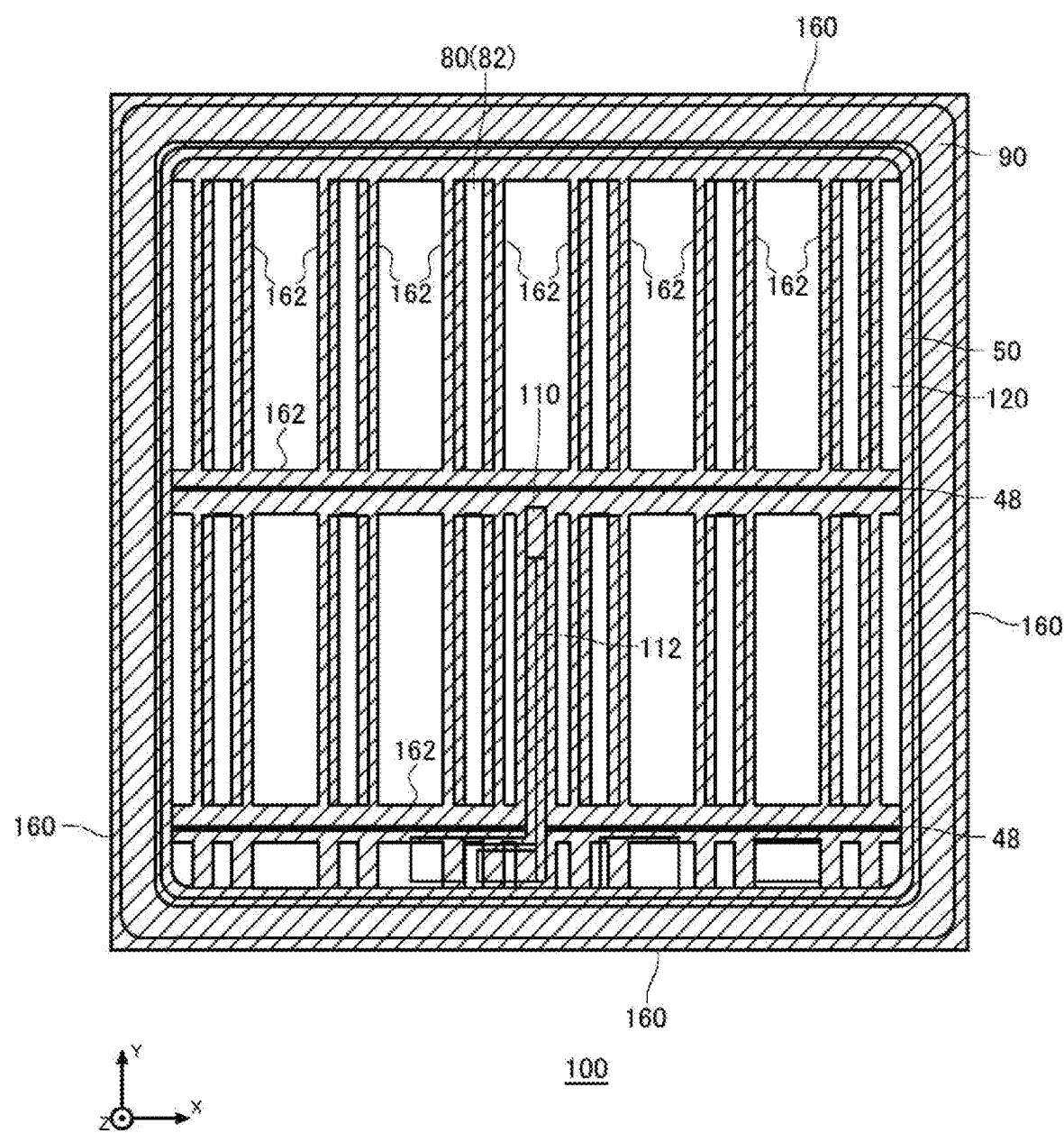
FIG. 15 illustrates another example of a lower end lifetime control unit 160 and a lower active section lifetime control unit 162.

FIG. 15 illustrates another example of a lower end lifetime control unit 160 and a lower active section lifetime control unit 162. The lower end lifetime control unit 160 of the present example overlaps with an entire region of an edge termination structure section 90 in a top view of a semiconductor substrate 10. The lower end lifetime control unit 160 may overlap at least a part of a gate metal layer 50, may overlap an entire region of the gate metal layer 50, or may overlap a partial region of an active section 120.

As illustrated in FIG. 15, an end portion of the lower end lifetime control unit 160 in the Y-axis direction faces an end portion of a cathode region 82 in the Y-axis direction. That is, the end portion of the lower end lifetime control unit 160 in the Y-axis direction and the end portion of the cathode region 82 in the Y-axis direction may have the same position in the Y-axis direction. This can effectively suppress a movement of carriers from the edge termination structure section 90 to the active section 120 while reducing an influence on characteristics of a diode section 80. The lower end lifetime control unit 160 of the present example may be applied to a semiconductor device 100 of each aspect illustrated in FIGS. 1 to 14.

The lower active section lifetime control unit 162 of the present example overlaps with at least a partial region of a gate runner 48, a temperature-sensing section 110, and a temperature-sensing wire 112 in a top view of the semiconductor substrate 10. The lower active section lifetime control unit 162 may overlap entire regions of the gate runner 48, the temperature-sensing section 110, and the temperature-sensing wire 112. The lower active section lifetime control unit 162 may overlap an entire well region 11 provided in the semiconductor substrate 10. This configuration can also suppress a movement of carriers from below the well region 11 or the like to a transistor section 70 and the diode section 80. The lower active section lifetime control unit 162 of the present example may be applied to a semiconductor device 100 of each aspect illustrated in FIGS. 1 to 14.

Figure 16:
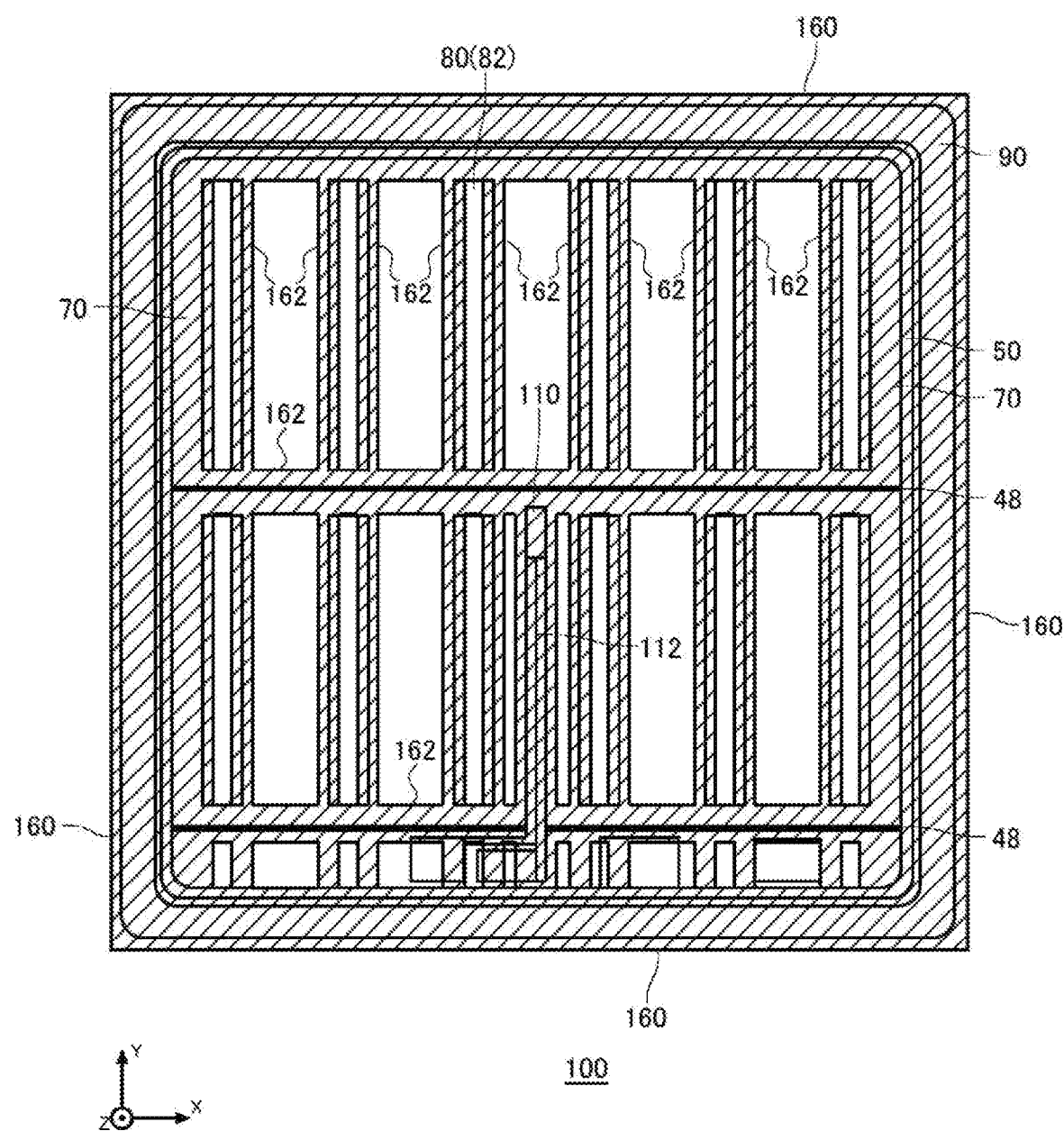
FIG. 16 illustrates another example of a lower end lifetime control unit 160.

FIG. 16 illustrates another example of a lower end lifetime control unit 160. The lower end lifetime control unit 160 of the present example overlaps with an entire region of a transistor section 70 arranged at an end portion of an active section 120 in the X-axis direction. This can further suppress carriers from moving from an edge termination structure section 90 in the Y-axis direction and reaching a diode section 80. The lower end lifetime control unit 160 of the present example may be applied to a semiconductor device 100 of each aspect illustrated in FIGS. 1 to 15.

Figure 17:
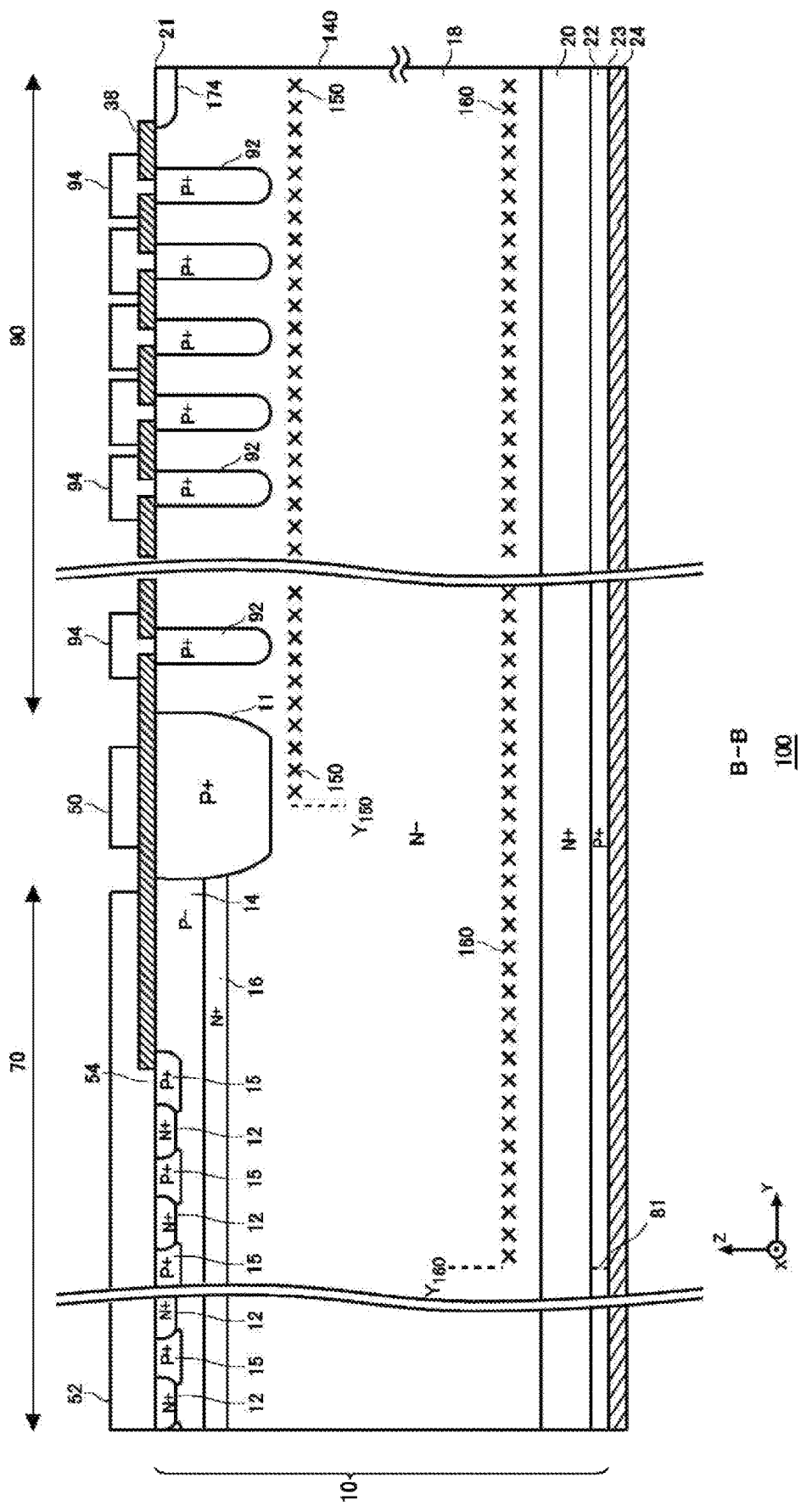
FIG. 17 illustrates another example of a cross section taken along B-B.

FIG. 17 illustrates another example of a cross section taken along B-B. As described above, upper end lifetime control unit 150 is provided in a range wider than an edge termination structure section 90. The upper end lifetime control unit 150 of the present example overlaps with an entire region of the edge termination structure section 90 and a partial well region 11 provided below a gate metal layer 50. The upper end lifetime control unit 150 may be provided in a range overlapping with the entire well region 11.

A lower end lifetime control unit 160 may also be provided in a range wider than the edge termination structure section 90. The lower end lifetime control unit 160 of the present example overlaps with an entire region of the edge termination structure section 90, may overlap the entire well region 11 provided below the gate metal layer 50, and may overlap a partial region of a transistor section 70. The lower end lifetime control unit 160 may be provided to a position overlapping with a contact hole 54.

In FIG. 17, a position of an end portion 81 of a cathode region 82 on the Y-axis is indicated by a dotted line. As described above, a farthest end portion position $Y_{160}$ of the lower end lifetime control unit 160 may face the end portion 81. In the present specification, an end portion of a lifetime control unit is a point at which a lifetime killer concentration starts to become higher than a lifetime killer concentration in a drift region 18 when a lifetime killer concentration distribution from the drift region 18 toward a killer region in each axial direction is measured. However, when the point is unclear, a position at which a lifetime killer concentration becomes half maximum (at 10% of maximum) of a peak concentration in a lifetime control unit may be an end portion.

Figure 18:
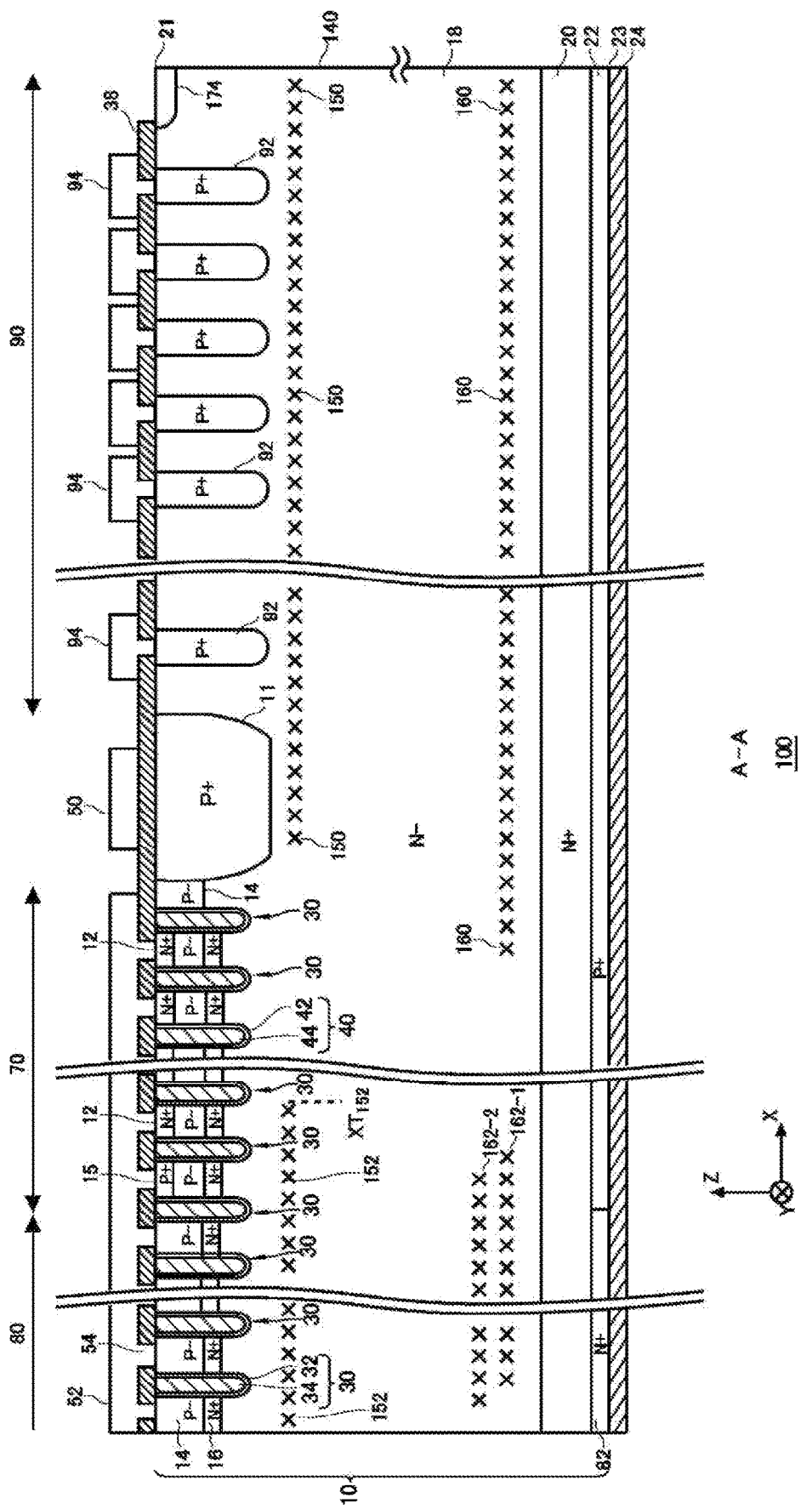
FIG. 18 illustrates another example of a cross section taken along A-A.

FIG. 18 illustrates another example of a cross section taken along A-A. As described above, an upper end lifetime control unit 150 is provided in range wider than an edge termination structure section 90. The upper end lifetime control unit 150 of the present example overlaps with the entire region of the edge termination structure section 90 and a partial region of a well region 11 provided below a gate metal layer 50. The upper end lifetime control unit 150 may be provided to a range overlapping with the entire well region 11.

Lower end lifetime control unit 160 may also be provided in a range wider than the edge termination structure section 90. The lower end lifetime control unit 160 of the present example overlaps with an entire region of the edge termination structure section 90, the entire well region 11 provided below the gate metal layer 50, and a partial region of a transistor section 70.

A lifetime killer concentration distribution of any one of lifetime control units in a depth direction of a semiconductor substrate 10 may have a plurality of peak. In an example of FIG. 18, a lower active section lifetime control unit 162 has a plurality of peaks. A lower active section lifetime control unit 162 closer to a lower surface 23 may be longer in the X-axis direction in the transistor section 70. This configuration allows effectively recombining carriers moving from a collector region 22 of the transistor section 70 to an upper surface 21 side of a diode section 80.

Figure 19A:
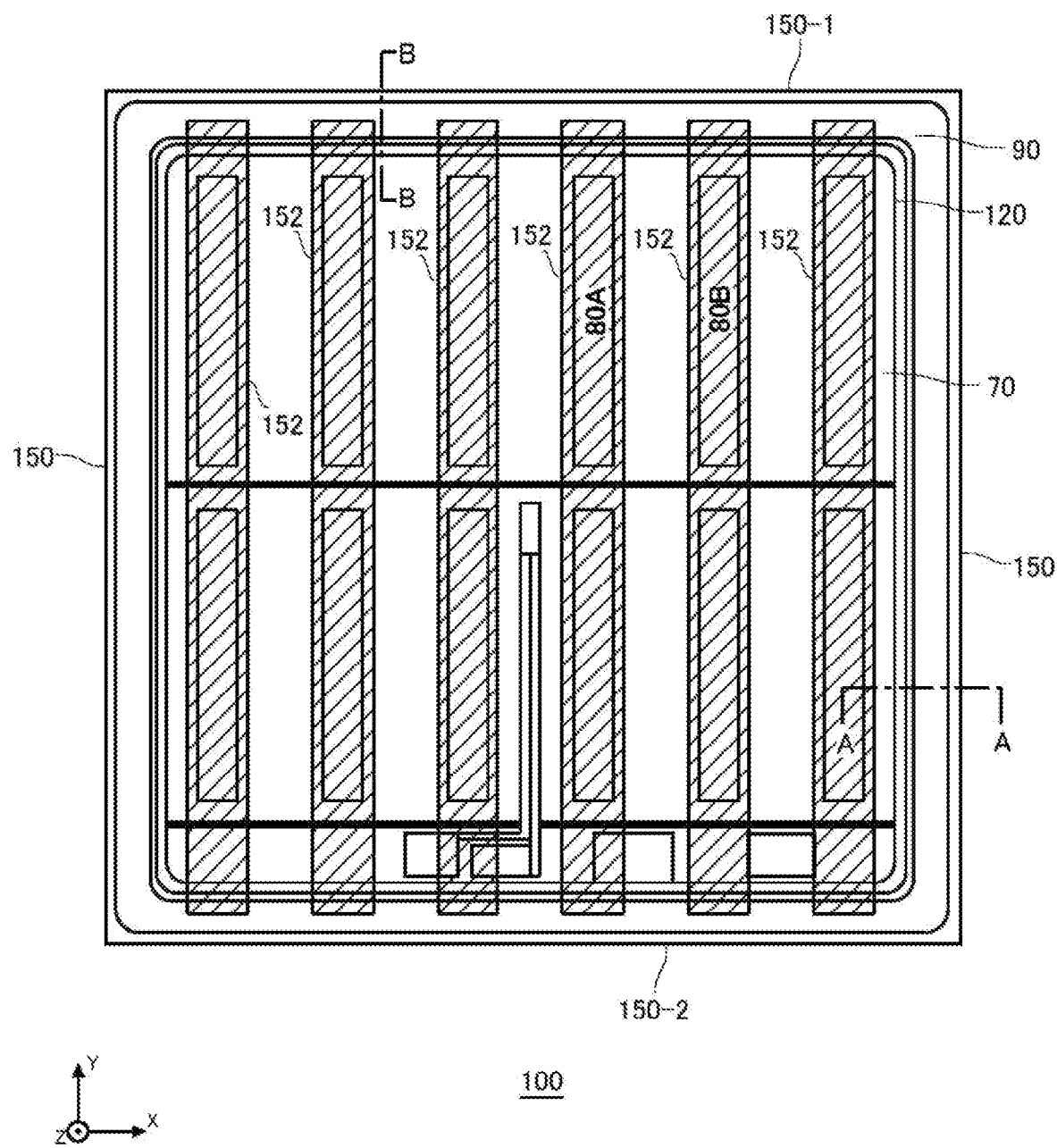
FIG. 19A illustrates another exemplary arrangement of a lifetime control unit.

FIG. 19A illustrates another exemplary arrangement of an upper side lifetime control unit. A semiconductor device 100 of the present example differs from each example of FIGS. 1 to 18 in that an end lifetime control unit does not include an upper end lifetime control unit 150. Other structures are the same as those of the semiconductor device 100 in any aspect illustrated in FIGS. 1 to 18. The end lifetime control unit includes a lower end lifetime control unit 160.

Each upper active section lifetime control unit 152 of the present example extends to an edge termination structure section 90 in the Y-axis direction. Each upper active section lifetime control unit 152 may not extend to the edge termination structure section 90. Even in this case, the upper active section lifetime control unit 152 overlaps with an entire cathode region 82. An end portion of the upper active section lifetime control unit 152 in the Y-axis direction may be provided in an active section 120, may be provided below a gate metal layer 50, or may be provided below a well region 11.

Figure 19B:
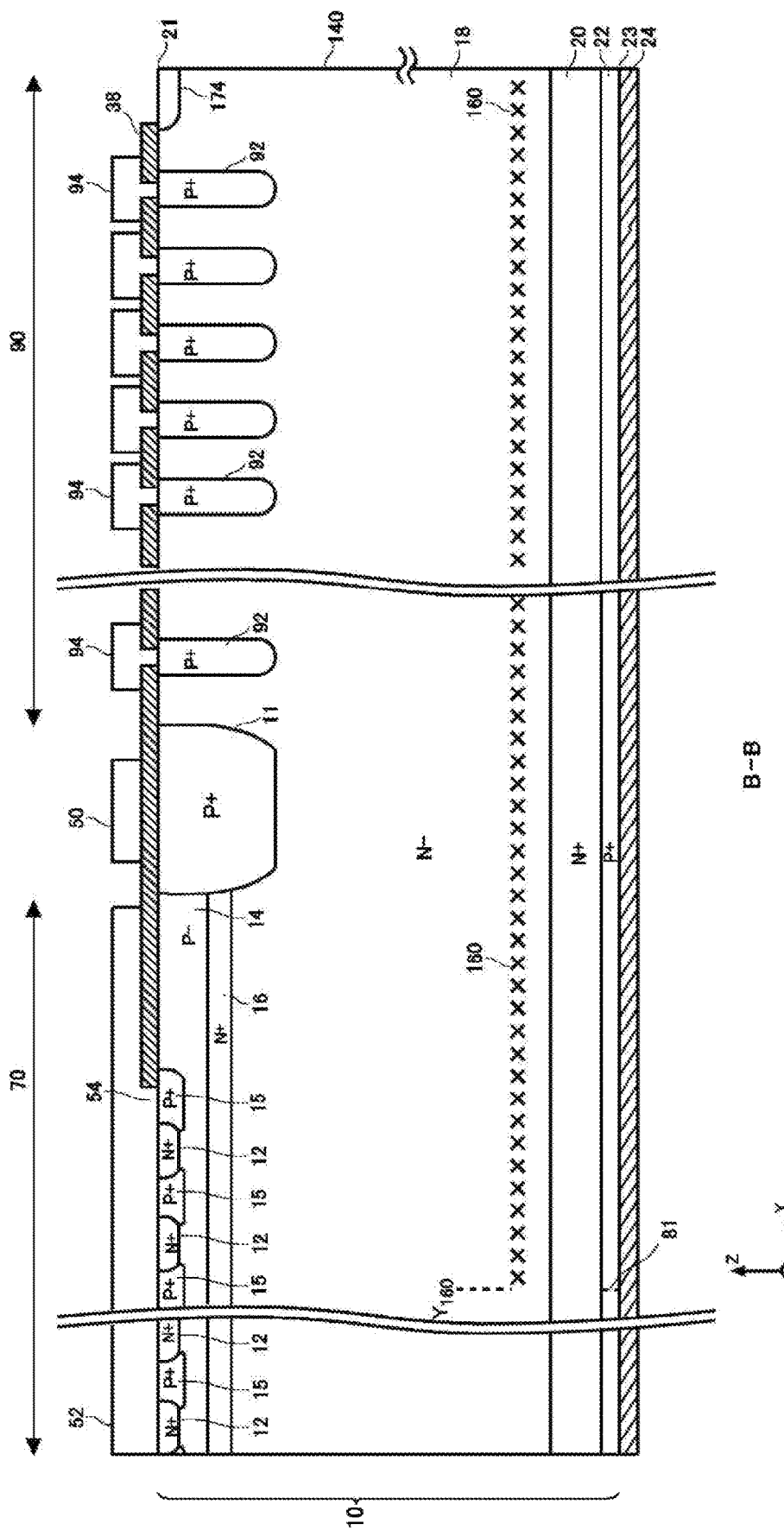
FIG. 19B illustrates a cross section taken along B-B of FIG. 19A.

FIG. 19B illustrates a cross section taken along B-B of FIG. 19A. A semiconductor device 100 of the present example differs from a cross section B-B of FIG. 17 in that no upper end lifetime control unit 150 is provided. Other structures are the same as those of an example of FIG. 17. When an edge termination structure section 90 does not include an upper end lifetime control unit 150, a depletion layer expanding from an active section to the edge termination structure section 90 does not include lifetime killers of a lifetime control unit. This can suppress an occurrence of a leakage current. Provision of lower end lifetime control unit 160 in the edge termination structure section 90 can suppress a concentration of holes from a collector region 22 of the edge termination structure section 90 to an end portion of contact hole 54.

Figure 19C:
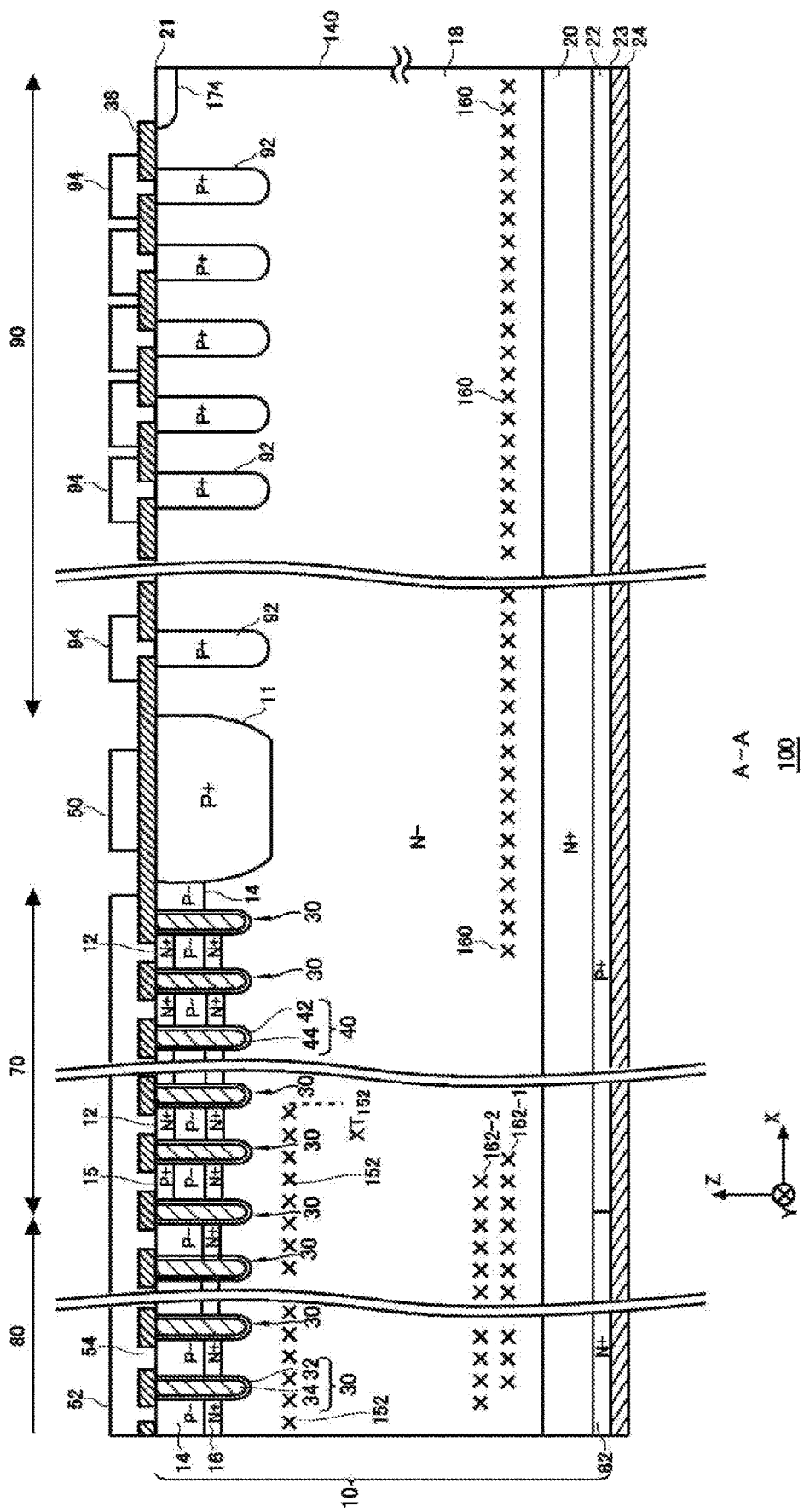
FIG. 19C illustrates a cross section taken along A-A of FIG. 19A.

FIG. 19C illustrates a cross section taken along A-A of FIG. 19A. A semiconductor device 100 of the present example differs from a cross section A-A of FIG. 18 in that no upper end lifetime control unit 150 is provided. Other structures are the same as those of an example of FIG. 18.

Figure 20:
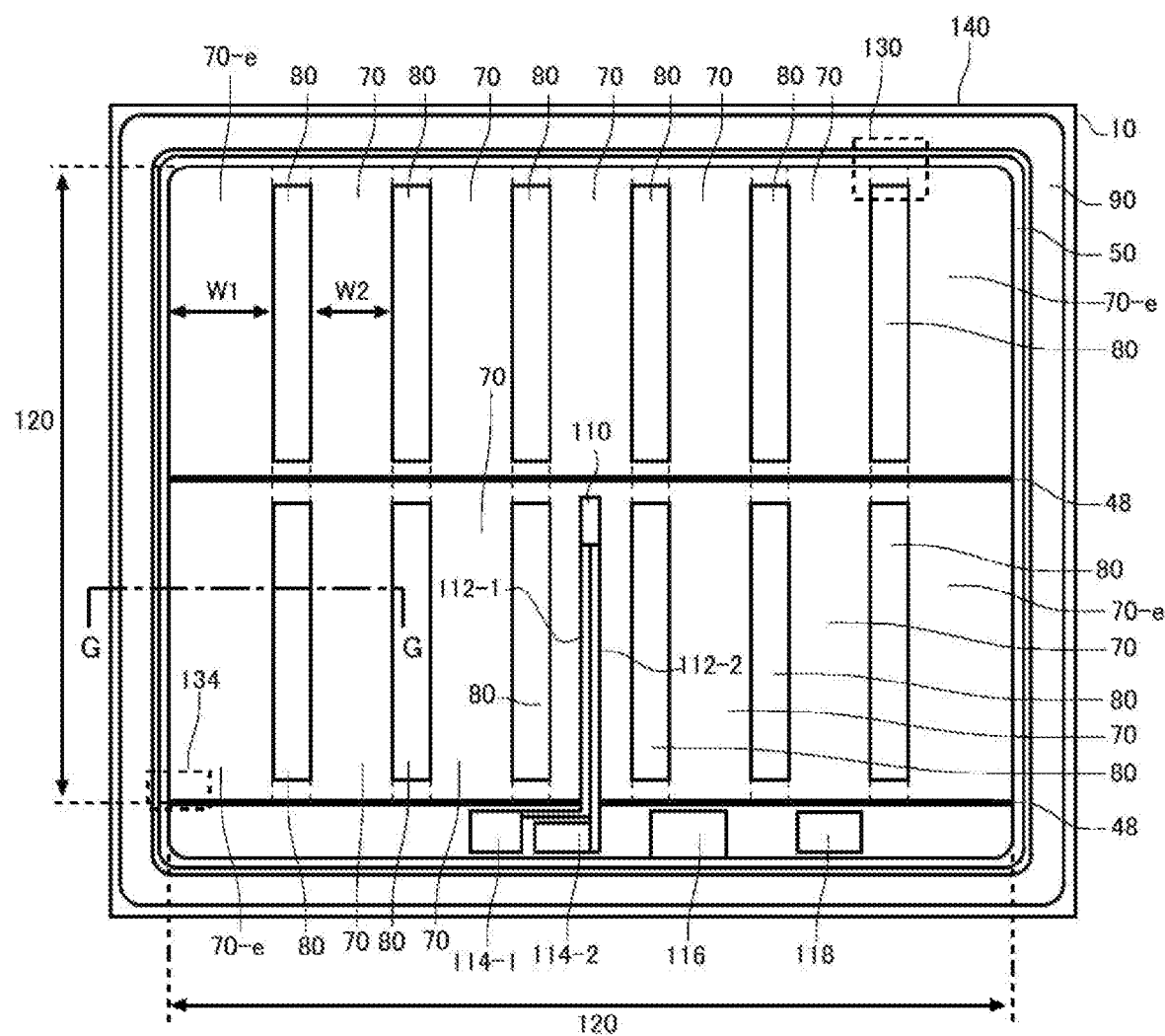
FIG. 20 illustrates another example of an upper surface structure of a semiconductor device 100.

FIG. 20 illustrates another example of an upper surface structure of a semiconductor device 100. In the semiconductor device 100 of the present example, a width w1 of a transistor section 70-e in the X-axis direction provided to an end portion in the X-axis direction differs from a width w2 of another transistor section 70 among transistor sections 70 arrayed in the X-axis direction. As illustrated in FIG. 20, the width w1 of the transistor section 70-e may be larger than the width w2 of another transistor section 70. The width w1 may be 1.1 time or more, 1.2 time or more, and 1.5 time or more of the width w2.

Figure 21:
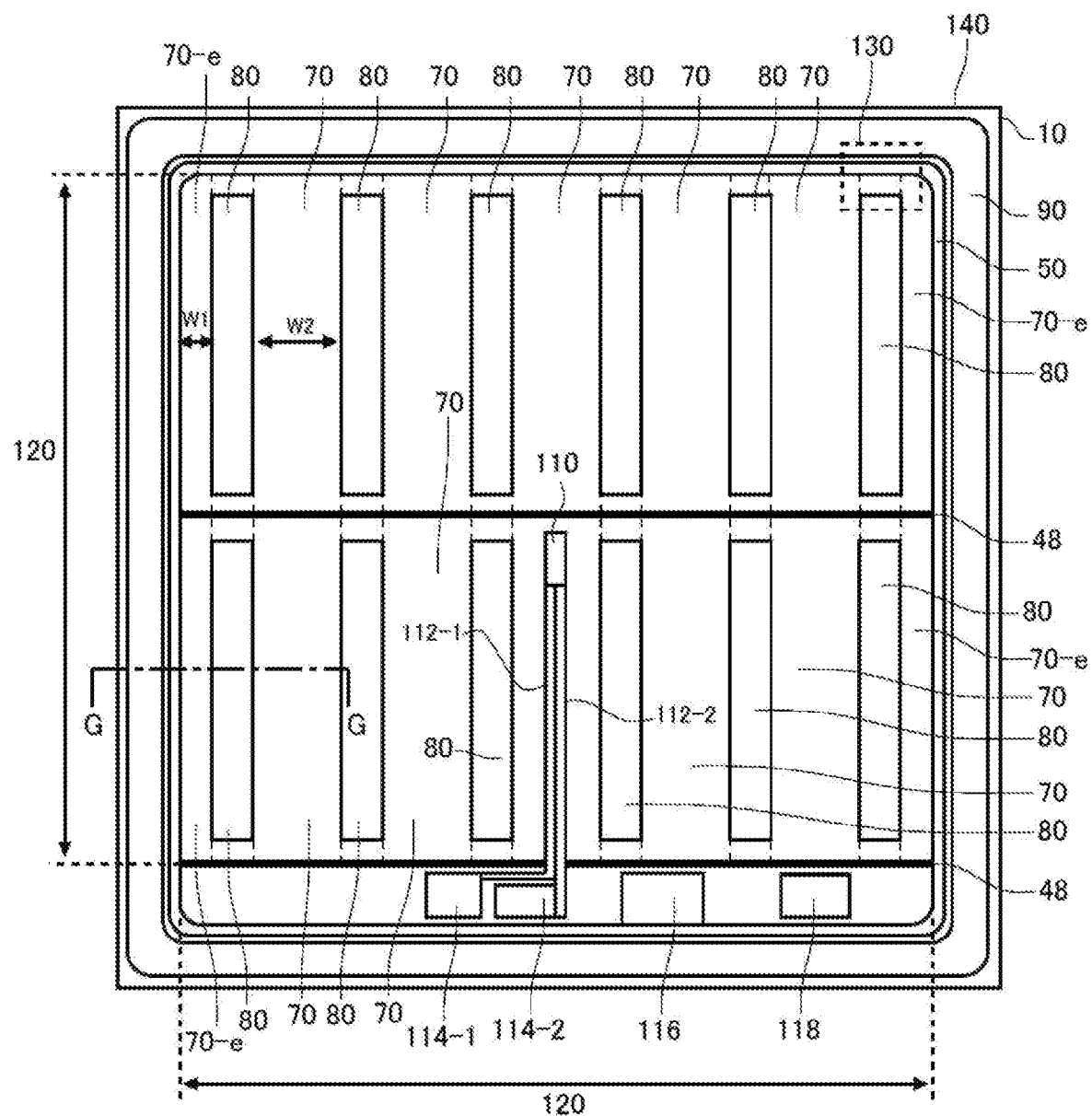
FIG. 21 illustrates an upper surface structure of a semiconductor device 100.

FIG. 21 illustrates an upper surface structure of a semiconductor device 100. The upper surface structure in FIG. 21 is the same as that of a semiconductor device 100 in FIG. 1. As illustrated in FIG. 21, a width w1 of a transistor section 70-e may be smaller than a width w2 of another transistor section 70. The width w1 may be two-thirds or less, may be half or less, and may be one-thirds or less of the width w2.

Figure 22:
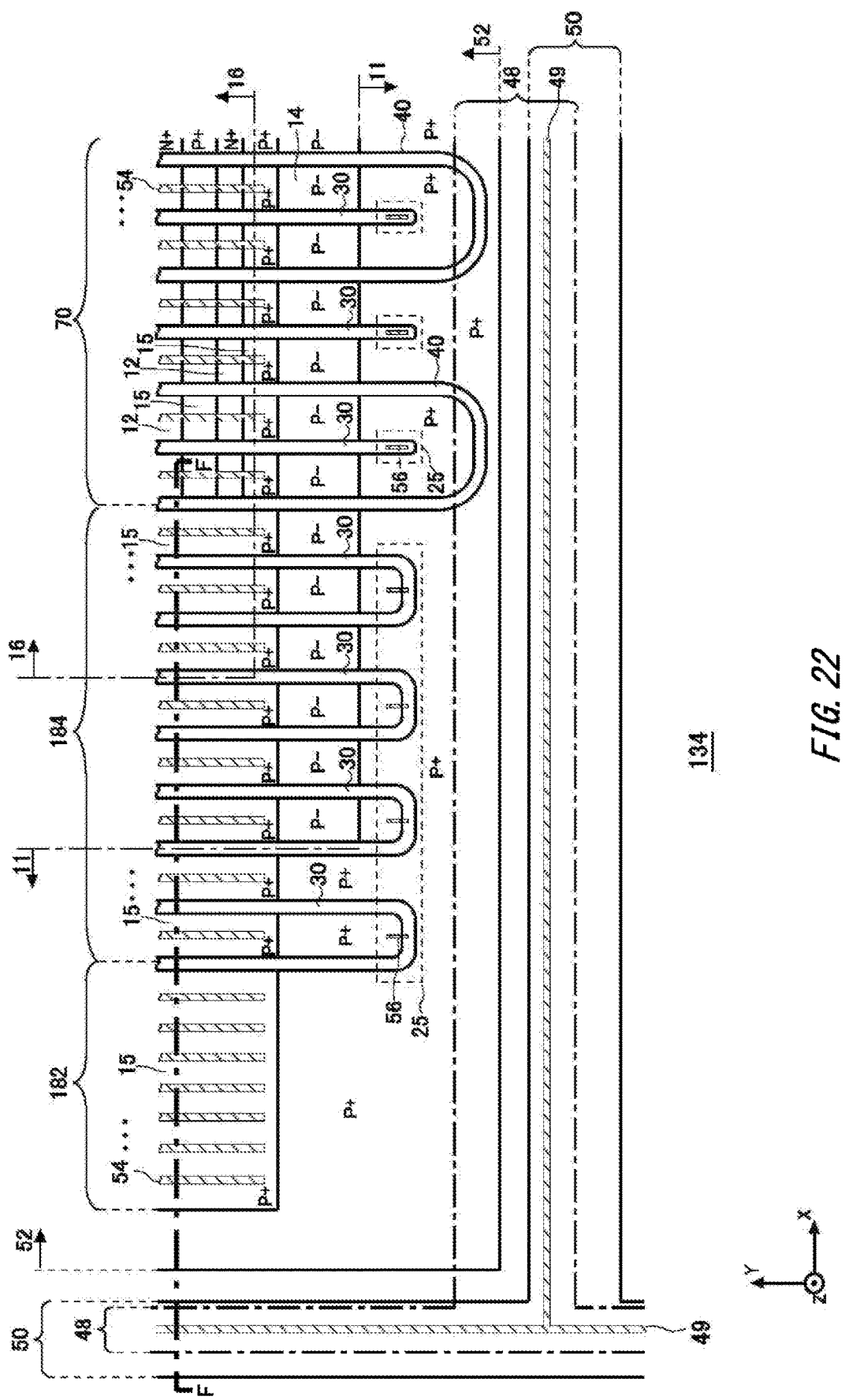
FIG. 22 is an enlarged top view of a region 134 in FIG. 20.

FIG. 22 is an enlarged top view of a region 134 in FIG. 20. Structures of a region 134 may be applied to a semiconductor device 100 of each aspect illustrated in FIGS. 1 to 21. In FIG. 22, a lifetime control unit is omitted.

The region 134 includes an end portion of an active section 120 in the X-axis direction. A transistor section 70 is provided in the end portion of the active section 120 in the X-axis direction. In the present example, a first termination region 182 and a second termination region 184 are provided between the transistor section 70 and a gate metal layer 50 in the X-axis direction. A semiconductor device 100 may include only one of the first termination region 182 and the second termination region 184. A collector region 22 is provided on a lower surface 23 of a semiconductor substrate 10 in the first termination region 182 and the second termination region 184.

Figure 23:
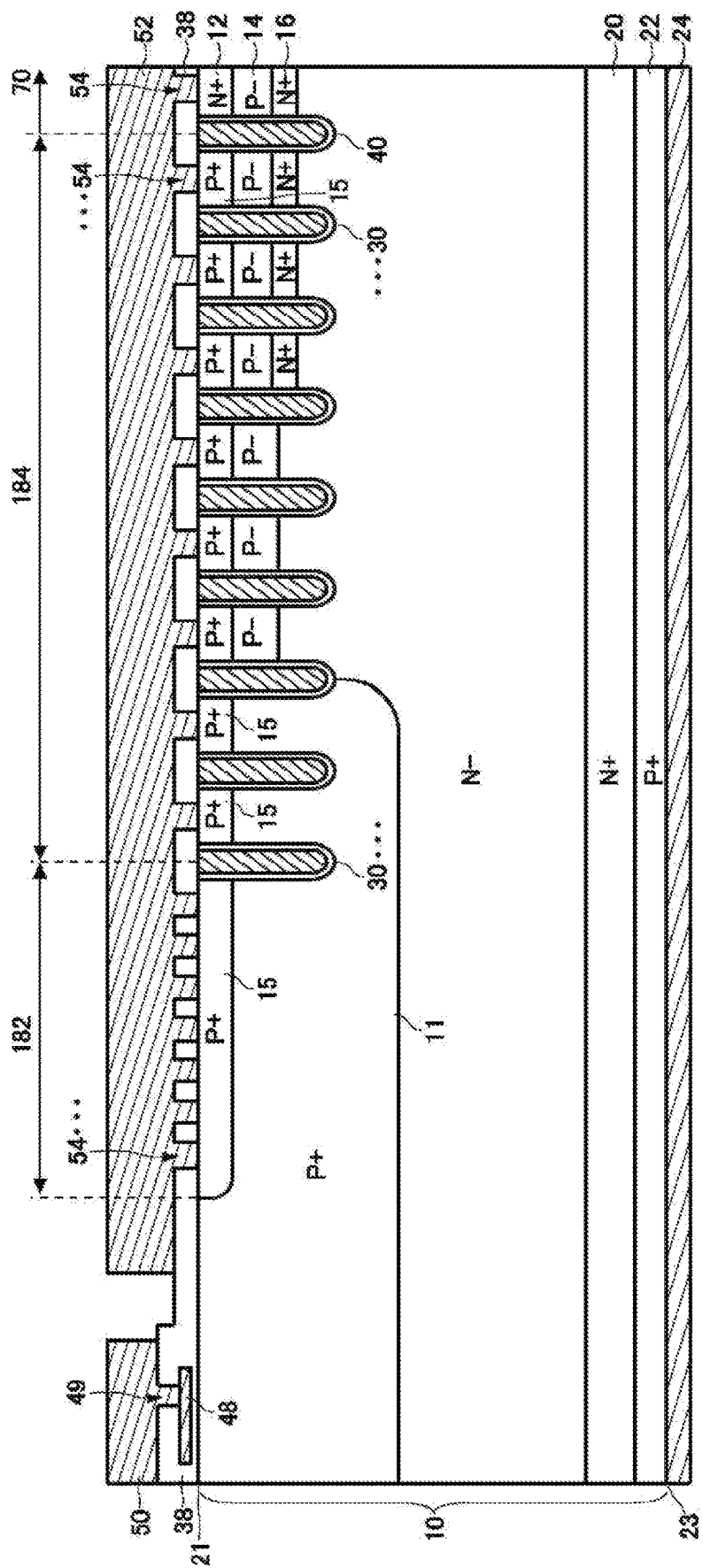
FIG. 23 illustrates one example of a cross section taken along F-F of FIG. 22.

FIG. 23 illustrates one example of a cross section taken along F-F of FIG. 22. The cross section F-F is an X-Z cross section including a gate metal layer 50, a first termination region 182, a second termination region 184, and a transistor section 70. In FIG. 23, a lifetime control unit is omitted.

The second termination region 184 is in contact to the transistor section 70 in the X-axis direction. The second termination region 184 includes a plurality of dummy trench sections 30 arrayed in the X-axis direction. As illustrated in FIG. 22, an area of a contact region 15 of a mesa section 60 of the second termination region 184 in top view is larger than an area of a contact region 15 of a mesa section 60 of the transistor section 70 in top view. This makes it easy to extract holes in the second termination region 184. This allows suppressing a current from flowing between a structure on a periphery 140 side of an edge termination structure section 90 or the like and the transistor section 70.

At least a part of the mesa section 60 of the second termination region 184 may not include an accumulation region 16. In examples of FIG. 22 and FIG. 23, an accumulation region 16 is provided in a part of a mesa section 60 on the transistor section 70 side and an accumulation region 16 is not provided in a part of a mesa section 60 on the gate metal layer 50 side in the second termination region 184.

At least a part of dummy trench sections 30 in the second termination region 184 may be provided in a well region 11. In the examples of FIGS. 22 and 23, a part of dummy trench sections 30 on the gate metal layer 50 side in the second termination region 184 is provided in the well region 11. That is, in an active section 120, a trench section arranged on the outermost side among trench sections arrayed in the X-axis direction is provided inside the well region 11. This allows protecting a trench section in which electric fields are relatively concentrated.

The first termination region 182 is provided between the second termination region 184 and the gate metal layer 50 in the X-axis direction. The first termination region 182 does not include a trench section. The contact region 15 may be exposed at an upper surface of the first termination region 182. The first termination region 182 may include a plurality of contact holes 54 extending in the Y-axis direction. A contact hole 54 connects an emitter electrode 52 to the contact region 15. The first termination region 182 may overlap the well region 11 in a top view. A length of a contact hole 54 in the first termination region 182 in the Y-axis direction may be the same as or longer than a length of a contact hole 54 in the transistor section 70 in the Y-axis direction.

Provision of the first termination region 182 allows extracting holes even outside the second termination region 184. This allows suppressing a current from flowing between a structure on the periphery 140 side of the edge termination structure section 90 or the like and the transistor section 70.

Figure 24:
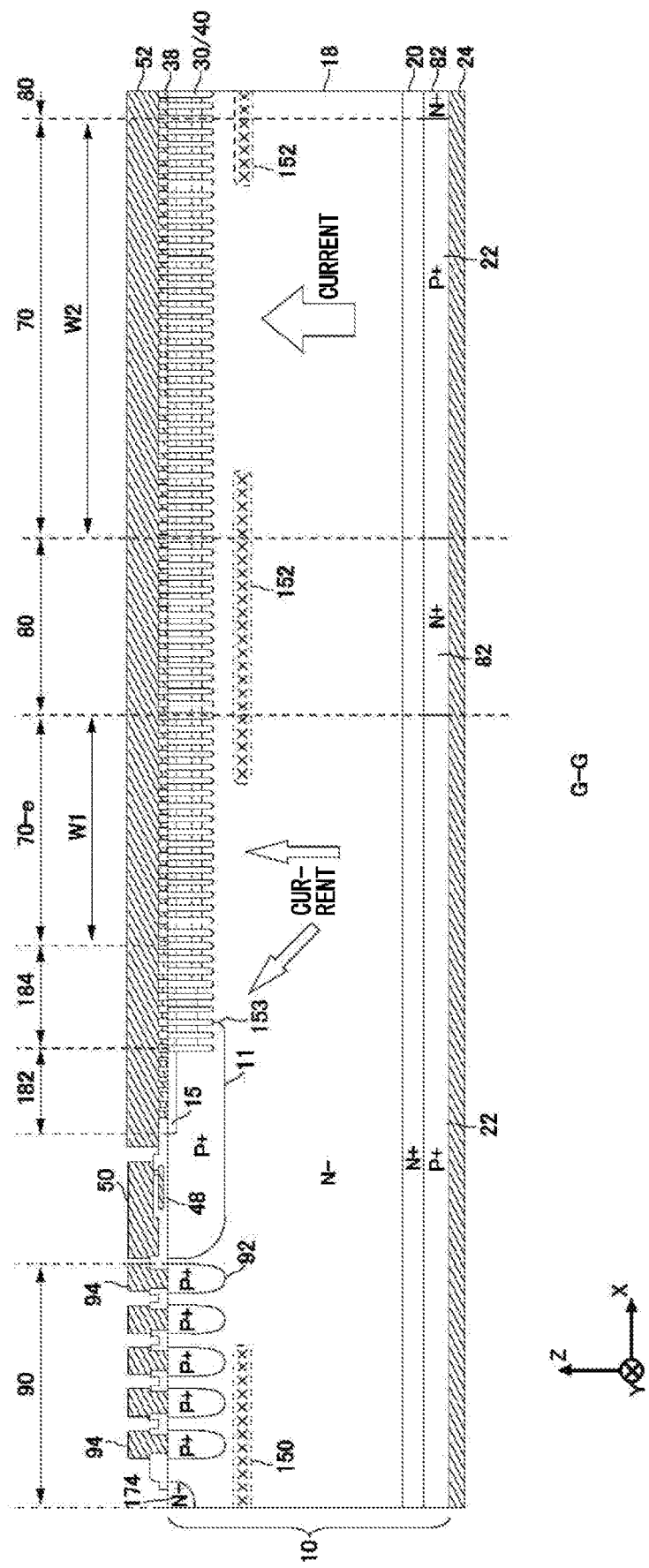
FIG. 24 illustrates one example of a cross section taken along G-G of FIG. 21.

FIG. 24 illustrates one example of a cross section taken along G-G of FIG. 21. The cross section G-G is an X-Z cross section including an edge termination structure section 90, a gate metal layer 50, a first termination region 182, a second termination region 184, a plurality of transistor sections 70, and a plurality of diode sections 80. In the cross section G-G, a lower side lifetime control unit is omitted. A semiconductor device 100 of the present example may include any of lower side lifetime control units illustrated in FIGS. 1 to 23. In FIG. 24, magnitudes of currents flowing from a lower surface to an upper surface of a semiconductor substrate 10 is schematically indicated by thicknesses of arrows.

In the present example, a width w1 of a transistor section 70-e is smaller than a width w2 of another transistor section 70. Therefore, a current flowing in the transistor section 70-e is smaller than a current flowing in another transistor section 70. This can relax a current flowing from the transistor section 70-e to a boundary 153 between an active section 120 and a well region 11. The boundary 153 is an end portion closest to the transistor section 70-e among end portions of the well region 11 in the X-axis direction.

Electric fields tend to concentrate on the boundary 153 between the active section 120 and the well region 11. Therefore, if a large amount of current flows in the boundary 153 between the active section 120 and the well region 11, both electric fields and currents are concentrated on the boundary 153, and thus, a breakdown is easily caused in the boundary 153. In the present example, currents flowing in the boundary 153 between the active section 120 and the well region 11 can be relaxed, and thus, the breakdown in the boundary 153 can be suppressed.

Figure 25:
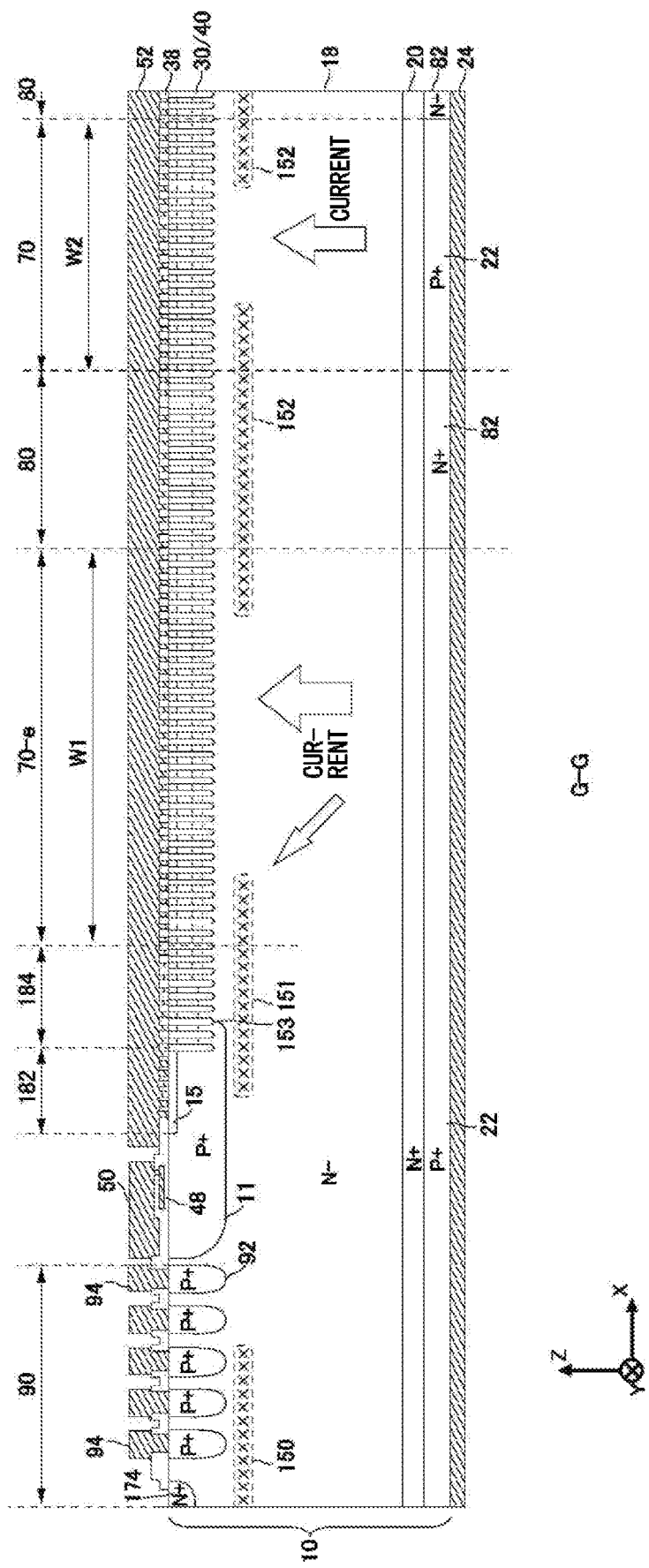
FIG. 25 illustrates one example of a cross section taken along G-G of FIG. 20.

FIG. 25 is one example of a cross section taken along G-G of FIG. 20. In the present example, a width w1 of a transistor section 70-e is larger than a width w2 of another transistor section 70. In this case, a semiconductor device 100 may include an upper boundary lifetime control unit 151. The upper boundary lifetime control unit 151 overlaps with a boundary 153 between an active section 120 and a well region 11. The well region 11 is arranged below a gate metal layer 50. The upper boundary lifetime control unit 151 may extend from the boundary 153 to a position overlapping with a second termination region 184 in the X-axis direction and may extend to a position overlapping with the transistor section 70-e in the X-axis direction.

The upper boundary lifetime control unit 151 may extend from the boundary 153 to a position overlapping with a first termination region 182 in the X-axis direction, may extend to a position overlapping with the gate metal layer 50 in the X-axis direction, and may extend to a position overlapping with an edge termination structure section 90 in the X-axis direction. The upper boundary lifetime control unit 151 may be connected to an upper end lifetime control unit 150. That is, the upper boundary lifetime control unit 151 may extend to a position of the upper end lifetime control unit 150.

In the present example, the width w1 of the transistor section 70-e is large, and thus relatively large currents flow in the transistor section 70-e. On the other hand, provision of the upper boundary lifetime control unit 151 below the boundary 153 can relax currents flowing in the boundary 153. Therefore, a breakdown in the boundary 153 can be suppressed.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10: semiconductor substrate, 11: well region, 12: emitter region, 14: base region, 15: contact region, 16: accumulation region, 18: drift region, 20: buffer region, 21: upper surface, 22: collector region, 23: lower surface, 24: collector electrode, 25: connection portion, 29: straight line portion, 30: dummy trench section, 31: edge portion, 32: dummy insulating film, 34: dummy conductive section, 38: interlayer dielectric film, 39: straight line portion, 40: gate trench section, 41: edge portion, 42: gate insulating film, 44: gate conductive section, 48: gate runner, 49: contact hole, 50: gate metal layer, 52: emitter electrode, 54: contact hole, 56: contact hole, 60: mesa section, 70: transistor section, 80: diode section, 81: end portion, 82: cathode region, 90: edge termination structure section, 92: guard ring, 94: field plate, 100: semiconductor device, 110: temperature-sensing section, 112: temperature-sensing wire, 114: temperature sensing pad, 116: gate pad, 118: emitter pad, 120: active section, 130: region, 131: range, 132: region, 134: region, 140: outer peripheral edge, 150: upper end lifetime control unit, 151: upper boundary lifetime control unit, 152: upper active section lifetime control unit, 153: boundary, 160: lower end lifetime control unit, 162: lower active section lifetime control unit, 174: channel stopper, 182: first termination region, 184: second termination region

What is claimed is:

1. A semiconductor device comprising:
   a semiconductor substrate;
   an active section provided in the semiconductor substrate;
   an edge termination structure section provided between the active section and an outer peripheral edge of the semiconductor substrate on an upper surface of the semiconductor substrate; and
   an end lifetime control unit that is provided in the semiconductor substrate in the edge termination structure section, the end lifetime control unit facing the active section in a second direction perpendicular to a predetermined first direction in top view and being continuous in a range facing, in the second direction, at least two or more diode sections arranged in the first direction, wherein
   the active section includes:
   a transistor section; and
   the diode sections alternately arranged with the transistor section in the first direction on the upper surface of the semiconductor substrate.

2. The semiconductor device according to claim 1, wherein
   the end lifetime control unit is provided in a circular pattern to surround the active section on a plane parallel to the upper surface of the semiconductor substrate.

3. The semiconductor device according to claim 1, further comprising:
   an active section lifetime control unit provided in the semiconductor substrate in the diode sections; wherein
   the end lifetime control unit and the active section lifetime control unit are continuous in the second direction on a plane parallel to the upper surface of the semiconductor substrate.

4. The semiconductor device according to claim 3, wherein
   the end lifetime control unit includes an upper end lifetime control unit arranged closer to the upper surface from a center in the semiconductor substrate in a depth direction perpendicular to the upper surface of the semiconductor substrate.

5. The semiconductor device according to claim 4, wherein
   the active section lifetime control unit includes an upper active section lifetime control unit that is arranged closer to the upper surface from a center in the semiconductor substrate in a depth direction perpendicular to the upper surface of the semiconductor substrate; and
   the upper active section lifetime control unit and the upper end lifetime control unit are not continuous in the first direction.

6. The semiconductor device according to claim 4, wherein
   the transistor section is provided to an end portion of the active section in the first direction; and
   the upper end lifetime control unit does not overlap at least a part of the transistor section provided to the end portion in the first direction.

7. The semiconductor device according to claim 4, wherein
   the end lifetime control unit includes a lower end lifetime control unit that is arranged closer to a lower surface from a center in the semiconductor substrate in a depth direction perpendicular to the upper surface of the semiconductor substrate.

8. The semiconductor device according to claim 7, wherein
   the active section lifetime control unit includes a lower active section lifetime control unit that is arranged closer to a lower surface from the center in the semiconductor substrate in a depth direction perpendicular to the upper surface of the semiconductor substrate; and
   the lower active section lifetime control unit and the lower end lifetime control unit are continuous in the second direction.

9. The semiconductor device according to claim 7, wherein
   the transistor section is provided to an end portion of the active section in the first direction; and
   the lower end lifetime control unit does not overlap at least a part of the transistor section provided to the end portion in the first direction.

10. The semiconductor device according to claim 7, wherein
    the transistor section is provided to an end portion of the active section in the first direction; and
    the lower end lifetime control unit overlaps with an entire region of the transistor section provided to the end portion in the first direction.

11. The semiconductor device according to claim 7, wherein
    the diode sections include a cathode region that is in contact with the lower surface of the semiconductor substrate in the semiconductor substrate; and
    the lower end lifetime control unit is arranged in a region not overlapping with the cathode region on a plane parallel to the upper surface of the semiconductor substrate.

12. The semiconductor device according to claim 11, wherein
    an end portion of the lower end lifetime control unit in the second direction faces an end portion of the cathode region in the second direction.

13. The semiconductor device according to claim 3, further comprising:
    a gate runner provided above the upper surface of the semiconductor substrate in the active section; wherein
    the active section lifetime control unit is also arranged below the gate runner.

14. The semiconductor device according to claim 6, wherein
    a width in the first direction of the transistor section provided to an end portion of the active section in the first direction is larger than a width of another transistor section.

15. The semiconductor device according to claim 6, wherein
    a width in the first direction of the transistor section provided to an end portion of the active section in the first direction is smaller than a width of another transistor section.

16. The semiconductor device according to claim 1, wherein
    the end lifetime control unit includes a lower end lifetime control unit that is arranged closer to a lower surface from a center in the semiconductor substrate and does not include an upper end lifetime control unit that is arranged closer to the upper surface from a center in the semiconductor substrate in a depth direction perpendicular to the upper surface of the semiconductor substrate.

17. A semiconductor device comprising:
a semiconductor substrate;
an active section provided in the semiconductor substrate;
an edge termination structure section provided between the active section and an outer peripheral edge of the semiconductor substrate on an upper surface of the semiconductor substrate; and
an upper end lifetime control unit that is provided in the semiconductor substrate in the edge termination structure section, the upper end lifetime control unit facing the active section in a second direction perpendicular to a predetermined first direction in top view and being continuous in a range facing, in the second direction, at least two or more diode sections arranged in the first direction, wherein the active section includes:
a transistor section,
wherein the diode sections alternately arranged with the transistor section in the first direction on the upper surface of the semiconductor substrate, and
wherein the upper end lifetime control unit is provided in a pattern to surround the active section on a plane parallel to the upper surface of the semiconductor substrate;
an upper active section lifetime control unit provided in the semiconductor substrate in the diode sections,
wherein the upper active section lifetime control unit is in the form of a plurality of strips that are continuous in the second direction with the upper end lifetime control unit on a plane parallel to the upper surface of the semiconductor substrate, and
wherein the upper active section lifetime control unit and the upper end lifetime control unit are not continuous in the first direction such that portions of the transistor section do not overlap the upper active section lifetime control unit.

18. The semiconductor device according to claim 17, wherein
the upper end lifetime control unit and the upper active section lifetime control unit are arranged closer to the upper surface from a center in the semiconductor substrate in a depth direction perpendicular to the upper surface of the semiconductor substrate.

19. The semiconductor device according to claim 18, wherein
the transistor section is provided to an end portion of the active section in the first direction in top view; and
the upper end lifetime control unit does not overlap at least a part of the transistor section provided to the end portion of the active section in the first direction.

20. The semiconductor device according to claim 19, wherein
the diode sections in their entirety overlap the upper active section lifetime control unit.

* * * * *